US012421608B2

(12) United States Patent
Brown et al.

(10) Patent No.: US 12,421,608 B2
(45) Date of Patent: Sep. 23, 2025

(54) RPCVD APPARATUS AND METHODS FOR FORMING A FILM

(71) Applicant: Gallium Enterprises Pty Ltd, Silverwater (AU)

(72) Inventors: Joshua David Brown, Silverwater (AU); Satyanarayan Barik, Silverwater (AU); Stephen Richard O'Farrell, Silverwater (AU); Ian Mann, Silverwater (AU)

(73) Assignee: Gallium Enterprises Pty Ltd, Silverwater (AU)

( * ) Notice: Subject to any disclaimer, the term of this patent is extended or adjusted under 35 U.S.C. 154(b) by 463 days.

(21) Appl. No.: 17/640,017

(22) PCT Filed: Sep. 4, 2020

(86) PCT No.: PCT/AU2020/050931
§ 371 (c)(1),
(2) Date: Mar. 3, 2022

(87) PCT Pub. No.: WO2021/042170
PCT Pub. Date: Mar. 11, 2021

(65) Prior Publication Data
US 2022/0316063 A1      Oct. 6, 2022

(30) Foreign Application Priority Data

Sep. 4, 2019    (AU) ................................ 2019903264

(51) Int. Cl.
*C23C 16/50*          (2006.01)
*C23C 16/30*          (2006.01)
(Continued)

(52) U.S. Cl.
CPC ............ *C23C 16/50* (2013.01); *C23C 16/303* (2013.01); *C23C 16/4408* (2013.01);
(Continued)

(58) Field of Classification Search
None
See application file for complete search history.

(56) References Cited

U.S. PATENT DOCUMENTS

2011/0033966 A1     2/2011   Su et al.
2011/0212624 A1*    9/2011   Hudson ............. H01J 37/32596
                                                      156/345.29
(Continued)

FOREIGN PATENT DOCUMENTS

AU       2005289367 B2    12/2009
CN        109943829 A      6/2019
(Continued)

OTHER PUBLICATIONS

Nov. 2, 2020—(WO) International Search Report and Written Opinion—App PCT/AU2020/050931.

*Primary Examiner* — Parviz Hassanzadeh
*Assistant Examiner* — Laureen Chan
(74) *Attorney, Agent, or Firm* — Banner & Witcoff, Ltd.

(57) ABSTRACT

RPCVD apparatus for forming a film is disclosed including a showerhead having at least one gas chamber, one or more plasma inlets to deliver plasma from one or more plasma generators into a reaction chamber; and a plurality of gas inlets to deliver gas from at least one gas chamber into the reaction chamber. At least one of the plasma inlets is located at a position that is between a central region and an outer region of the showerhead and off-centre from an axis of rotation. The plasma generators generate plasma in line of sight of the susceptor and the plasma inlets have openings that are larger than openings of the gas inlets. The gas inlets are configured such that a combination of all of the spatial distributions of gas from the gas inlets provides a uniform distribution of gas density on the surface of a susceptor (Continued)

between a central region and an outer region of the susceptor, for a full rotation of the susceptor.

24 Claims, 26 Drawing Sheets

(51) Int. Cl.
| | | |
|---|---|---|
| C23C 16/44 | (2006.01) | |
| C23C 16/452 | (2006.01) | |
| C23C 16/455 | (2006.01) | |
| C23C 16/458 | (2006.01) | |
| C23C 16/52 | (2006.01) | |
| H01J 37/32 | (2006.01) | |

(52) U.S. Cl.
CPC ...... *C23C 16/452* (2013.01); *C23C 16/45565* (2013.01); *C23C 16/4584* (2013.01); *C23C 16/52* (2013.01); *H01J 37/32357* (2013.01); *H01J 37/3244* (2013.01); *H01J 37/32449* (2013.01); *H01J 37/32715* (2013.01); *H01J 2237/20214* (2013.01); *H01J 2237/3321* (2013.01)

(56) References Cited

U.S. PATENT DOCUMENTS

| | | | |
|---|---|---|---|
| 2011/0253044 A1 | 10/2011 | Tam et al. | |
| 2012/0100307 A1* | 4/2012 | Aida | H01J 37/32449 |
| | | | 118/723 R |
| 2013/0012030 A1 | 1/2013 | Lakshmanan et al. | |
| 2013/0059415 A1* | 3/2013 | Kato | C23C 16/45542 |
| | | | 438/106 |
| 2014/0073143 A1* | 3/2014 | Alokozai | C23C 16/45563 |
| | | | 257/E21.24 |
| 2015/0194298 A1 | 7/2015 | Lei et al. | |
| 2015/0240356 A1* | 8/2015 | Chen | C23C 16/45574 |
| | | | 137/602 |
| 2015/0279681 A1 | 10/2015 | Knoops et al. | |
| 2016/0326649 A1* | 11/2016 | Mann | H01J 37/32477 |
| 2017/0092470 A1* | 3/2017 | Ramaswamy | H01J 37/32449 |
| 2017/0167024 A1* | 6/2017 | Wiltse | C23C 16/45574 |
| 2018/0363134 A1 | 12/2018 | Honma et al. | |
| 2019/0376184 A1* | 12/2019 | Selep | H01J 37/32449 |

FOREIGN PATENT DOCUMENTS

| | | |
|---|---|---|
| TW | 201531585 A | 8/2015 |
| WO | 2010091470 A1 | 8/2010 |
| WO | 2014008557 A1 | 1/2014 |
| WO | 2015106318 A1 | 7/2015 |

\* cited by examiner

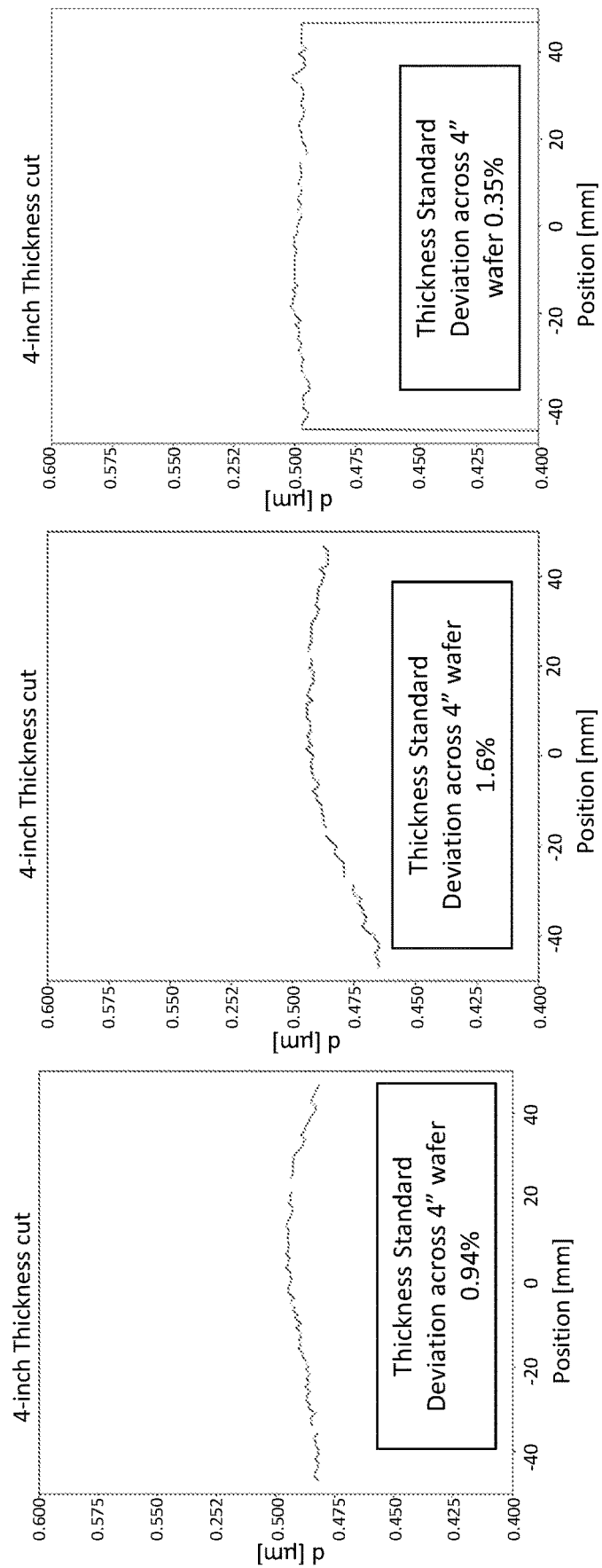

RPCVD APPARATUS AND METHODS FOR FORMING A FILM

CROSS-REFERENCE TO RELATED APPLICATIONS

The present application is a U.S. National Stage application under 35 U.S.C. § 371 of International Application PCT/AU2020/050931 (published as WO/2021/042170 A1), filed Sep. 4, 2020, which claims the benefit of priority to Application AU 2019903264, filed Sep. 4, 2019. Benefit of the filing date of these prior applications is hereby claimed. Each of these prior applications is hereby incorporated by reference in its entirety.

TECHNICAL FIELD

The present invention relates to apparatus and methods for the production of films by chemical vapour deposition

BACKGROUND

Metal or metalloid containing films, such as gallium nitride (GaN) films, have applications in a range of devices from light emitting diodes (LEDs) to ultraviolet detectors to transistor devices.

These films have commonly been formed on substrates by deposition techniques including Metal-Organic Chemical Vapour Deposition (MOCVD) and Remote Plasma Enhanced Chemical Vapour Deposition (RPECVD or RPCVD). RPCVD has been employed to produce films of high quality at considerably lower temperatures than those used in MOCVD, thereby reducing process costs and allowing the use of temperature sensitive preferred substrates for film deposition.

The RPCVD process is similar to conventional MOCVD in that both technologies deliver a metal reagent into a reaction chamber in the form of a gaseous flow of metal-organic (MO) molecules with a carrier gas of $N_2$ or $H_2$, for example. The MO molecules are stable below a few hundred degrees Celsius, and therefore can be flowed into the reactor though small injectors, nozzles or slits (collectively referred herein as inlets), whereby the arrangements of the inlets can be designed to produce a uniform density of MO across a large area. The MO molecules are then thermally dissociated at or near the growth surface to enable the reaction with an active nitrogen species.

MOCVD and RPCVD differ in how the nitrogen species are delivered. In MOCVD, the nitrogen species is delivered in the form of $NH_3$. The $NH_3$ is a stable gas that can be flowed through similar injectors to those used for the MO source, and so a straightforward arrangement of inlets can be designed to produce a uniform density of both $NH_3$ and MO at the growth surface. An arrangement of such inlets is typically referred to as a showerhead (SH).

RPCVD delivers the nitrogen species in the form of a plasma, particularly a plasma generated from a gas comprising nitrogen, thus generating a nitrogen plasma. The nitrogen plasma is generated remotely, and the plasma is then delivered into the reactor in the excited state in order to react with the MO to grow the film. Typically, a single plasma inlet is provided. To provide a uniform plasma density at the growth surface from a single plasma inlet, attempts have been made to distribute plasma evenly over the growth surface using a showerhead type plasma distribution arrangement or a baffle (e.g. as proposed in the inventors' earlier patent application WO2010091470A1).

However, while $NH_3$ used in MOCVD is a stable gas, in RPCVD, because the various excited states of the plasma are not stable, active nitrogen species can undergo both spontaneous and collision-induced decay. The collision-induced decay can occur during a collision between two molecules in the gas phase, or during a collision between a plasma species and the walls of the RPCVD apparatus, including walls of showerheads or baffles. These collisions quench the active nitrogen species leading to a reduction in the density of active species arriving at the growth surface. This places considerable design constraints on RPCVD apparatus that are not a factor for MOCVD.

Any discussion of documents, acts, materials, devices, articles or the like which has been included in the present specification is not to be taken as an admission that any or all of these matters form part of the prior art base or were common general knowledge in the field relevant to the present disclosure as it existed before the priority date of each of the appended claims.

SUMMARY

According to one aspect of the present disclosure, there is provided an RPCVD apparatus for forming a film comprising:
one or more plasma generators to generate a plasma from a gas source comprising nitrogen gas;
a reaction chamber in which to react a metal organic reagent with an active nitrogen species derived from the plasma so as to deposit a film on one or more substrates;
a showerhead having:
at least one gas chamber;
one or more plasma inlets to deliver plasma from the one or more plasma generators into the reaction chamber; and
a plurality of gas inlets to deliver gas from the at least one gas chamber into the reaction chamber;
a susceptor for supporting one or more substrates in the reaction chamber at a surface of the susceptor between a central region and an outer region of the susceptor, the susceptor being configured to rotate relative to the showerhead around an axis of rotation;
wherein at least one of the plasma inlets is located at a position that is between a central region and an outer region of the showerhead and off-centre from the axis of rotation;
wherein the gas inlets are distributed in a pattern at a surface of the showerhead between the central region and the outer region of the showerhead,
wherein the gas inlets each direct gas having a respective spatial distribution of gas at the surface of the susceptor,
wherein the plasma generators generate plasma in line of sight of the susceptor and the plasma inlets have openings that are larger than openings of the gas inlets; and
wherein the gas inlets are configured such that a combination of all of the spatial distributions of gas provides a uniform distribution of gas density on the surface of the susceptor between a central region and an outer region of the susceptor, for a full rotation of the susceptor.

According to another aspect of the present disclosure, there is provided a method of forming a film using the RPCVD apparatus of the immediately preceding aspect.

According to another aspect of the present disclosure, there is provided a method of forming a film using an RPCVD apparatus, the method comprising:

delivering plasma, through one or more plasma inlets of a showerhead of the RPCVD apparatus, into a reaction chamber, the plasma being generated by one or more plasma generators from a gas source comprising nitrogen gas;

delivering gas comprising a metal organic reagent from at least one gas chamber of the showerhead, through a plurality of gas inlets of the showerhead, into the reaction chamber, such that the metal organic reagent reacts with active nitrogen species derived from the plasma in the reaction chamber;

wherein a susceptor is located in the reaction chamber, the susceptor supporting one or more substrates in the reaction chamber at a surface of the susceptor between a central region and an outer region of the susceptor, the susceptor rotating relative to the showerhead around an axis of rotation;

wherein at least one of the plasma inlets is located at a position that is between a central region and an outer region of the showerhead and off-centre from the axis of rotation;

wherein the gas inlets are distributed in a pattern at a surface of the showerhead between the central region and the outer region of the showerhead;

wherein the plasma generators generate plasma in line of sight of the susceptor and the plasma inlets have openings that are larger than openings of the gas inlets;

wherein the gas inlets each direct gas having a respective spatial distribution of gas at the surface of the susceptor, and wherein the gas inlets are configured such that a combination of all of the spatial distributions of gas provides a uniform distribution of gas density on the surface of the susceptor between a central region and an outer region of the susceptor, for a full rotation of the susceptor.

In any one or more aspects described herein, the gas inlets may be distributed in a radially and rotationally asymmetric pattern at the surface of the showerhead. The gas inlets may be configured in one or more spiral or augmented spiral patterns, for example. Nevertheless, in some embodiments, the gas inlets may be distributed in other patterns such as an at least partly or completely uniform pattern at the surface of the showerhead. The gas inlets may be distributed so that they partly or entirely surround the plasma inlets, e.g. so that one or more, or all, plasma inlets are surrounded by respective gas inlets.

The opening of each plasma inlet may have a maximum diameter that is significantly larger than the maximum diameter of the opening of each gas inlet. For example, the maximum diameter of each plasma inlet may be at least 30×, at least 50×, at least 70×, at least 90×, at least 110×, at least 130×, or more, of the maximum diameter of the opening of each gas inlet. Additionally or alternatively, the opening of each plasma inlet may have an area that is at least 500×, at least 1000×, at least 10,000×, at least 20,000×, or at least 50,0000×, or more, of the area of the opening of each gas inlet.

In some embodiments, the gas inlets may be distributed over a major part of the surface of the showerhead. For example, the gas inlets may be distributed over an area that is more than 50%, 65%, 70%, 75%, 80%, 85%, 90% or 95% of the area of the surface of the showerhead between the central region and outer region of the showerhead. In some embodiments, the gas inlets may be distributed substantially over the entire surface of the showerhead, except for where plasma inlets are located. In some embodiments, if the surface of the showerhead is divided into four notional quadrants, the gas inlets may be distributed in 3 or all 4 of the quadrants. Additionally or alternatively, if the surface of the showerhead is divided into four concentric notional rings of equal width between the central and outer region, the gas inlets may be distributed in 3 or all 4 of the rings.

The one or more off-centre plasma inlets may be positioned directly over the region of the susceptor that is between the central region and the outer region of the susceptor. Despite this, the present inventors have determined that it is possible to achieve substantially uniform distributions of gas density, and in some embodiments both gas density and plasma density, on the surface of the susceptor between the central region and the outer region of the susceptor through the positioning of plasma and gas inlets and including through utilising the rotation of the susceptor. Substantially uniform distributions of gas density may be evident from substantially flat gas density profiles between the central region and outer region of the susceptor, for a full rotation of the susceptor.

The substantially uniform distributions of gas density may be achieved in some embodiments by clustering of the gas inlets at first regions of the surface of the showerhead to provide space in the showerhead to accommodate the one or more plasma inlets located at second regions of the surface of the showerhead. The clustering may be such that substantially the same distribution of gas density is retained at the surface of the susceptor, between the central region and the outer region of the susceptor, for a full rotation of the susceptor, as if the gas inlets were uniformly distributed across the first and second regions of the surface of the showerhead. The clustering may be such that the average distance between gas inlets and their respective closest adjacent gas inlet is lower at or adjacent notional circular paths at the surface of the showerhead, around the axis of rotation, where plasma inlets are located than at or adjacent notional circular paths at the surface of the showerhead, around the axis of rotation, where no plasma inlets or a fewer number of plasma inlets are located.

In some embodiments, the clustering of gas inlets may be more prevalent for gas inlets in areas at the same radial distance from the centre of the showerhead as one or more plasma inlets and in areas closer to the one more plasma inlets. Having gas inlets clustered closer to one or more plasma inlets may be advantageous as it may ensure that a substrate supported on the susceptor will have an increased exposure to gas from the gas inlets soon after or soon before suffering a decreased exposure to gas during exposure to plasma from the plasma inlet.

The gas inlets may comprise at least two subsets of gas inlets, e.g. at least a first subset of gas inlets and a second subset of gas inlets. In some embodiments, the gas inlets in a first subset of gas inlets may be distributed in a different pattern at surface of the showerhead to the gas inlets in a second subset of gas inlets. For example, the first subset of gas inlets may be distributed in a uniform pattern (e.g. a regular array such as a grid pattern, circular array or otherwise) and the second subset of gas inlets may be distributed in a non-uniform pattern, or otherwise. Alternatively, in some embodiments, the gas inlets in the first subset may be distributed in the same pattern at the surface of the showerhead to the gas inlets in the second subset of gas inlets. For example, the first subset of gas inlets may be distributed in a uniform pattern and the second subset of gas inlets may be distributed in a uniform pattern, or the first subset of gas inlets may be distributed in a non-uniform pattern and the second subset of gas inlets may be distributed in a non-uniform pattern.

The gas delivered by the first subset of gas inlets may be the same as the gas delivered by the second subset of gas inlets. Alternatively, the gas delivered by the first subset of gas inlets may be different from the gas delivered by the second subset of gas inlets. In some embodiments, the first subset of gas inlets delivers metal organic (MO) reagent gas, and the second set of gas inlets deliver ammonia ($NH_3$) gas. Alternatively, each subset of gas inlets may comprise gas inlets delivery different types of gas. For example each subset of gas inlets may comprise gas inlets delivering metal organic (MO) reagent gas and gas inlets delivering ammonia ($NH_3$) gas. In general, any reference to MO reagent gas or MO gas in the present specification is intended to cover a combination of gas and vapour, e.g. MO vapour carried by a carrier gas.

In some embodiments, a controller may be provided that controls the flux of gas delivered from each the subsets of gas inlets independently from each other. For example, the controller may allow a different gas flux to be applied to one subset in comparison to another subset, as desired.

The areas of the surface of the showerhead over which each subset of gas inlets are distributed can be considered different zones. For example, a first zone is defined herein as the area of the surface of the showerhead over which the first subset of gas inlets is distributed and a second zone is defined herein as the area of the surface of the showerhead over which the second subset of gas inlets is distributed. Generally the outer edges and outer shape of each zone are defined by the positions of the outermost gas inlets within the respective subset.

The first and second zones may have substantially the same outer shape or may have different outer shapes. Nevertheless, in some embodiments, whether or not the first and second gas inlets zones are of the same shape, the first and second zones may be of substantially the same area and/or may comprise substantially the same number of gas inlets. Where one or more further subsets of gas inlets are provided, e.g. a third subset of gas inlets, a fourth subset of gas inlets, and so on, corresponding zones, e.g. a third zone, a fourth zone, and so on, are defined, which may share corresponding numbers of inlets, sizes and/or shapes, etc., to the first and/or second zones.

In some embodiments, the individual radial density profiles of gas delivered from the different subsets of gas inlets/zones may not be uniform for a full rotation of the susceptor. In this regard, different subsets/zones may be considered to favour (e.g. may deliver greater gas density) to different regions of the susceptor dependent on the radial position of those regions on the susceptor. Nevertheless, the sum of the contributions from the different subsets of gas inlets/zones may be such that, for a full rotation of the susceptor, the final radial density profile is substantially uniform.

Thus, in one embodiment:
for each subset of gas inlets, a combination of all of the spatial distributions of gas from the gas inlets within that subset provides a non-uniform distribution of gas density on the surface of the susceptor between the central region and outer region of the susceptor, for a full rotation of the susceptor, and
the gas inlets are configured such that a combination of all of the non-uniform distributions of gas density provides a uniform distribution of gas density on the surface of the susceptor between the central region and outer region of the susceptor, for a full rotation of the susceptor.

Following from this, according to one aspect of the present disclosure, there is provided an RPCVD apparatus for forming a film comprising:
one or more plasma generators to generate a plasma from a gas source comprising nitrogen gas;
a reaction chamber in which to react a metal organic reagent with an active nitrogen species derived from the plasma so as to deposit a film on one or more substrates;
a showerhead having:
at least one gas chamber;
one or more plasma inlets to deliver plasma from the one or more plasma generators into the reaction chamber; and
a plurality of gas inlets to deliver gas from the at least one gas chamber into the reaction chamber;
a susceptor for supporting one or more substrates in the reaction chamber at a surface of the susceptor between a central region and an outer region of the susceptor, the susceptor being configured to rotate relative to the showerhead around an axis of rotation;
wherein the gas inlets are distributed in a pattern at a surface of the showerhead between the central region and the outer region of the showerhead and comprise two or more subsets of gas inlets,
a controller that controls the flux of gas delivered from each of the subsets of gas inlets independently from each other;
wherein the gas inlets each direct gas having a respective spatial distribution of gas at the surface of the susceptor,
wherein for each subset of gas inlets, a combination of all of the spatial distributions of gas from the gas inlets within that subset provides a non-uniform distribution of gas density on the surface of the susceptor between the central region and outer region of the susceptor, for a full rotation of the susceptor,
wherein the gas inlets are configured such that a combination of all of the non-uniform distributions of gas density provides a uniform distribution of gas density on the surface of the susceptor between the central region and outer region of the susceptor, for a full rotation of the susceptor.

In some embodiments, the first subset of gas inlets may deliver gas with a radial density profile that decreases, e.g. linearly, from the central to outer region of the susceptor and the second subset of gas inlets may deliver gas with a radial density profile that increases, e.g. linearly, from the central to outer region. Due to having substantially opposite linear profiles, the sum of the contributions from the different subsets of gas inlets/zones, for a full rotation of the susceptor, may provide for a uniform, flat density profile for a full rotation of the susceptor.

In some embodiments, the gas zones may be offset from one another in a rotational direction about the centre of the showerhead. For example, the first zone may be provided by a first sector of the surface of the showerhead (e.g. a first half or quadrant of the surface) and the second zone may be a second sector of the surface of the showerhead (e.g. a second non-overlapping half or quadrant of the surface). Where third or further zones are provided, these may be provided as further sectors. So that each of the zones can deliver, individually, gas having radial density profiles that are not flat, the gas inlets within each zone may be non-uniformly distributed.

In some embodiments, however, e.g. where it is desirable to utilise uniformly distributed gas inlets but ensure that different subsets of gas inlets favour different radially inner and outer regions of the susceptor, or otherwise, a different or more complex configuration of the zones may be provided.

For example, the first and second zones may at least partially overlap in a radial direction between the centre and outer region of the showerhead. Therefore, at least one notional radius on the surface of the showerhead between the central and outer region may pass through both the first and second zones. To achieve this, in some embodiments, the first zone may be a first circular or annular region (or part-circular or part-annular region) of the surface of showerhead and the second zone may be a second annular region (or part-annular region) of the surface of the showerhead that is radially outwards of the first region. Where third or further zones are provided, these may be provided as further annular or part-annular regions. So that each of the zones can deliver, individually, gas having radial density profiles that are not uniform, the number of gas inlets within each zone may differ, or the gas flux applied through each zone may be selected to differ, for example.

As another example, the first and second zones may partially overlap both in a radial direction between the centre and outer region of the showerhead and in a rotational direction around the centre of the showerhead. Therefore, at least one notional radius on the surface of the showerhead between the central and outer region may pass through both the first and second zones and at least one notional circular path about the centre of the surface of the showerhead may pass through both the first and second zones. To achieve this, in some embodiments, the first and second zones may have different outer shapes that are inverses of each other (e.g. negative and positive shapes of each other). In combination, the inverted outer shapes may form a sector of a circle or a full circle, depending on the overall distribution of gas inlets. In some embodiments, a notional line boundary line that delineates the first and second zones may be non-linear, e.g. all or part of the boundary line may be curved. Along the boundary line, one of the first and second zones may have at least one partly concave outer edge and the other of the first and second zones may have at least one partly convex outer edge. In some embodiments, the boundary line may extend all of the way between the central and outer region of the surface of the showerhead. In some embodiments, the boundary line may extend across substantially the entire diameter of the showerhead. Related to this, in some embodiments, each of the first and second zones may have at least one region that extends substantially a full radius from the central to the outer region of the surface of the showerhead. Accordingly, even though different zones may favour different radially located regions of the susceptor, as described above, each of the zones may provide some contribution to the gas density across substantially the entire final radial density profile.

Through the above configurations or otherwise, the number of gas inlets in the first subset may be higher than the number of gas inlets of the second subset at radially inner regions of the surface of the showerhead, and the number of gas inlets of the second subset may be higher than the number of gas inlets of the first subset at radially outer regions of the surface of the showerhead. This arrangement may be reflected in some embodiments by the first zone extending to a greater extent at radially inner regions of the surface of the showerhead than the second zone, and the second zone extending to a greater extent at a radially outer regions of the surface of the showerhead than the first zone.

As mentioned, the apparatus may comprise a controller to control the flux of gas delivered from one subset of gas inlets independently from the flux of gas delivered from another subset of gas inlets. The controller may control, or may comprise, a first mass flow controller (first MFC), which may be connected to the first subset of gas inlets, and a second mass flow controller (second MFC), which may be connected to the second subset of gas. Further MFCs may be connected to third or further subsets of gas inlets if provided.

The control may be used for the purpose of 'zone tuning' to obtain the substantially uniform distribution of gas density at the surface of the susceptor when the gas is delivered. For example, adjustments to the individual contribution from the gas inlets in each zone can yield fine tuning of the shape of the density profile. This adjustment can be used to compensate for known non-uniformities, and asymmetries, in the apparatus (e.g., reaction chamber) design which affect the radial density profile, such as asymmetries introduced by optionally having a load lock on one side, or by having perturbation of the gas flow due to the local proximity of a plasma inlet and/or by the plasma flow through the plasma inlet causing perturbation of the gas flow, or due to different chemical/formulation properties of the gas selected for delivery.

In some embodiments, the apparatus may be further configured such that:
  the plasma inlets are distributed in a pattern at a surface of the showerhead between the central region and the outer region of the showerhead;
  the plasma inlets each direct plasma having a respective spatial distribution of plasma intensity at the surface of the susceptor, and
  the one or more plasma generators and/or plasma inlets are configured such that a combination of all of the spatial distributions of plasma intensity provides a substantially uniform distribution of plasma density at the surface of the susceptor between the central region and the outer region of the susceptor, for a full rotation of the susceptor.

Thus, in a similar manner to the gas inlets, by combining the provision of multiple plasma inlets with a full rotation of the susceptor, a combination of all of the spatial distributions of plasma intensity from the plasma inlets can provide a substantially uniform distribution of plasma density at the surface of the susceptor between the central region and the outer region of the susceptor.

The plasma inlets are configured such that each is in line of sight of the susceptor, and therefore one or more substrates when supported on the susceptor. Each plasma inlet may be associated with a respective plasma generator, e.g., a respective plasma tube. For example, each plasma inlet may be a bottom opening of a respective plasma tube. By providing, in some embodiments, a plurality of plasma inlets, the plasma can be distributed broadly over the surface of the susceptor while having line of sight between the plasma inlets (and plasma generators such as plasma tubes) and the susceptor.

The present apparatus may ameliorate one or more shortcomings or disadvantages associated with thin film deposition apparatuses of the prior art. It may achieve substantially uniform distributions of plasma and gas while allowing relatively large, 'line of sight', inlets to be used for the injection of plasma, which may minimise the wall collisions and maximise the density of active nitrogen species reaching the susceptor.

The apparatus may be configured such that a notional circular path at the surface of the susceptor, around the axis of rotation and between the central region and the outer region of the susceptor, is exposed to a total plasma intensity, for a full rotation of the susceptor, that increases for increasing radial distance (r) of the circular path from the axis of rotation. The increase in total plasma intensity for increasing radial distance (r) of the circular path from the axis of rotation may be proportional to r. The showerhead may have more plasma inlets positioned towards the outer region of the showerhead than towards the central region of the showerhead. Additionally or alternatively, the showerhead may have one or more plasma inlets towards the outer region of the showerhead that are configured to direct plasma of higher plasma intensity than one or more plasma inlets positioned towards the central region of the showerhead.

To achieve the substantially uniform distribution of plasma the apparatus may be configured such that at least one notional circular path at the surface of the susceptor, around the axis of rotation, is exposed to overlapping plasma directed from at least two or three of the plasma inlets. In some embodiments, all notional circular paths at the surface of the susceptor, around the axis of rotation and between the central region and the outer region of the susceptor, may be exposed to overlapping plasma directed from at least two of the plasma inlets.

The plasma inlets may be positioned in some embodiments such that: at least one notional circular path at the showerhead, around the axis of rotation, passes through only one of the plasma inlets; and/or at least one notional circular path at the showerhead, around the axis of rotation, passes through at least two of the plasma inlets; and/or at least one notional circular path at the showerhead, around the axis of rotation, passes through at least three of the plasma inlets.

The apparatus may further comprise a controller to individually control the plasma intensity, and in some instances therefore the spatial distribution of plasma intensity, directed from one or more of the plasma inlets. To perform the control, the controller may adjust a gas flow from the gas source, comprising nitrogen gas, to the plasma inlet. Additionally or alternatively, the controller may adjust a power used to generate a plasma, and therefore adjust a plasma power.

In some embodiments, the diameter of all of the plasma inlets may be substantially the same. However, alternatively, two or more of the plasma inlets may have different diameters.

The plasma inlets may be distributed in a non-uniform pattern at the showerhead. The plasma inlets may be distributed in a non-radially symmetric pattern at the showerhead.

In some embodiments, the one or more of the plasma inlets may be partly or entirely surrounded by purge inlets, the purge inlets being configured to deliver purge gas. The purge gas may be nitrogen, for example. The purge gas may be selected so that it will not contribute to any deposition on a substrate (and therefore film thickness) or associated density profile, and can reduce unwanted recirculation of reagent gas. For example, it may prevent thin films forming on the showerhead and may help obtain better plasma gas distribution.

In one aspect, the present disclosure provides a showerhead for an RPCVD apparatus comprising:

one or more plasma inlets to deliver plasma from one or more plasma generators into a reaction chamber; and
a plurality of gas inlets to deliver gas from at least one gas chamber into the reaction chamber;
wherein at least one of the plasma inlets is located at a position that is between a central region and an outer region of the showerhead and off-centre from an axis of rotation of the RPCVD apparatus;
wherein the plasma generators generate plasma in line of sight of the susceptor and the plasma inlets are larger than the gas inlets; and
wherein the gas inlets are distributed in a pattern at a surface of the showerhead between the central region and the outer region of the showerhead.

According to one aspect of the present disclosure, there is provided an RPCVD apparatus comprising a showerhead according to the immediately preceding aspect.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

By way of example only, embodiments are now described with reference to the accompanying drawings, in which:

FIGS. 38A-C show graphs of thickness variation for a layer deposited on a wafer, for different plasma and zone-tuning conditions, using apparatus according to an embodiment of the present disclosure.

DESCRIPTION OF EMBODIMENTS

The production of metal nitride films has been described in detail in PCT Publication No. WO2014008557, and PCT Publication No. WO2015106318, and the entire content of each document is herein incorporated by reference.

The term "plasma" generally refers to a (partially) ionized gas comprising a mixture of ions, electrons, neutral species and radiation. While the term "plasma" is used herein to discuss both the species formed by ionization of a gas within the at least one plasma generator and that which passes through the plasma tube of the plasma generator, showerhead, and into the reaction or growth chamber of an RPCVD apparatus, it will be appreciated that the charged gas species may be largely extinguished during this journey from the ionising region of the plasma generator to the reaction chamber and, thus, references to "plasma" in these regions will be understood as also referring to active gas species.

With regards to the definitions provided herein, unless stated otherwise, or implicit from context, the defined terms and phrases include the provided meanings. Unless explicitly stated otherwise, or apparent from context, the terms and phrases below do not exclude the meaning that the term or phrase has acquired by a person skilled in the relevant art. The definitions are provided to aid in describing particular embodiments, and are not intended to limit the claimed invention. Furthermore, unless otherwise required by context, singular terms shall include pluralities and plural terms shall include the singular.

Herein the term "reagent gas" generally refers to a gas which will become activated (e.g. to become an "active gas" as also used herein) under a set of given conditions, such as those which undergo chemical reactions used to prepare films by chemical vapour deposition processes, as described herein.

The present disclosure may provide, at least in part, a showerhead comprising both large openings for the injection of plasma (plasma inlets) and also an arrangement of apertures for the injection of a reagent gas (gas inlets), whereby the location of any gas inlet does not coincide with the location of any plasma inlet. Further, the arrangement of both gas and plasma inlets in the showerhead is such that a substrate (wafer) under the showerhead is exposed across its surface to a substantially uniform density (flux per unit area) of each of the reagent gas and plasma, for a full rotation of the susceptor. It should be recognised, however, that while a substrate is exposed across its surface to a substantially uniform density of each of the reagent gas and plasma for a full rotation of the susceptor, the actual exposure of the substrate to the gas and/or plasma may not occur throughout a full rotation of the susceptor. For example, the exposure may occur during a fraction of the full rotation of the susceptor in some embodiments, e.g., during a 180 degree rotation or less in some embodiments.

Figure 1:
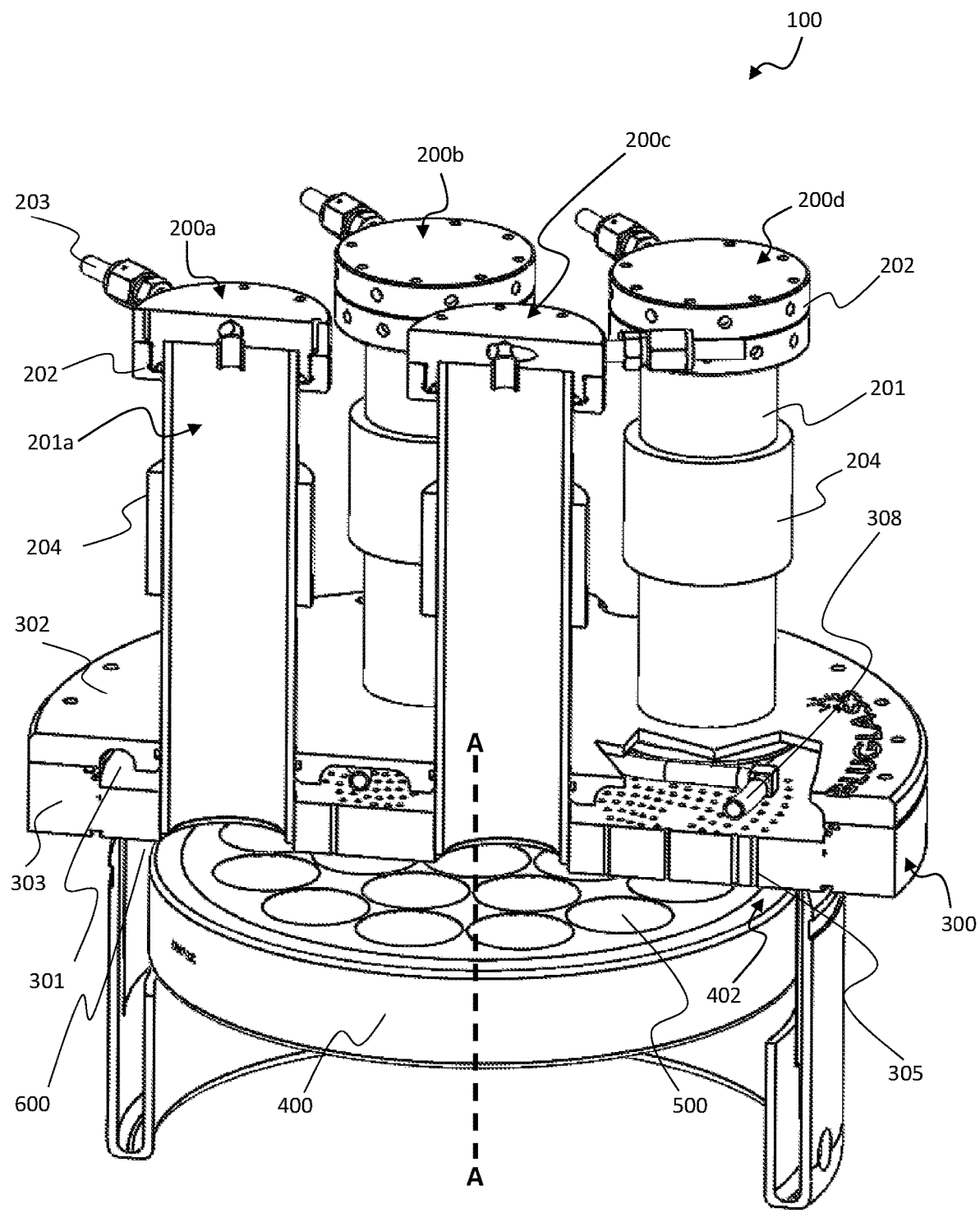
FIG. 1 shows a perspective sectional view of an RPCVD apparatus according to an embodiment of the present disclosure.

FIG. 1 shows a perspective sectional view of an apparatus 100 for the production of films by RPCVD processes according to one embodiment of the present disclosure. The apparatus 100 comprises one or more plasma generators 200a-d, a showerhead 300, a susceptor 400 configured to support one or more substrates 500, and a reaction chamber 600. Although the RPCVD apparatus 100 is shown as having four plasma generators 200a-d, other numbers of plasma generators may be included and may be positioned in various locations.

In the example shown, each of the four plasma generators 200a-d comprises a plasma tube 201, 201a having an end cap 202 having a plasma gas port 203 for providing at least one gas to the interior of the plasma tube 201a. Each plasma generator 200a-d further comprises a plasma generating region, or ionising region 204 to expose a region of the plasma tube 201 to an electromagnetic field for generating a plasma. In some embodiments, the electromagnetic field for generating a plasma is generated using an ionising source, such as a radio frequency (RF) source or a microwave source. In a preferred embodiment, the ionising source is an RF coil.

Figure 2:
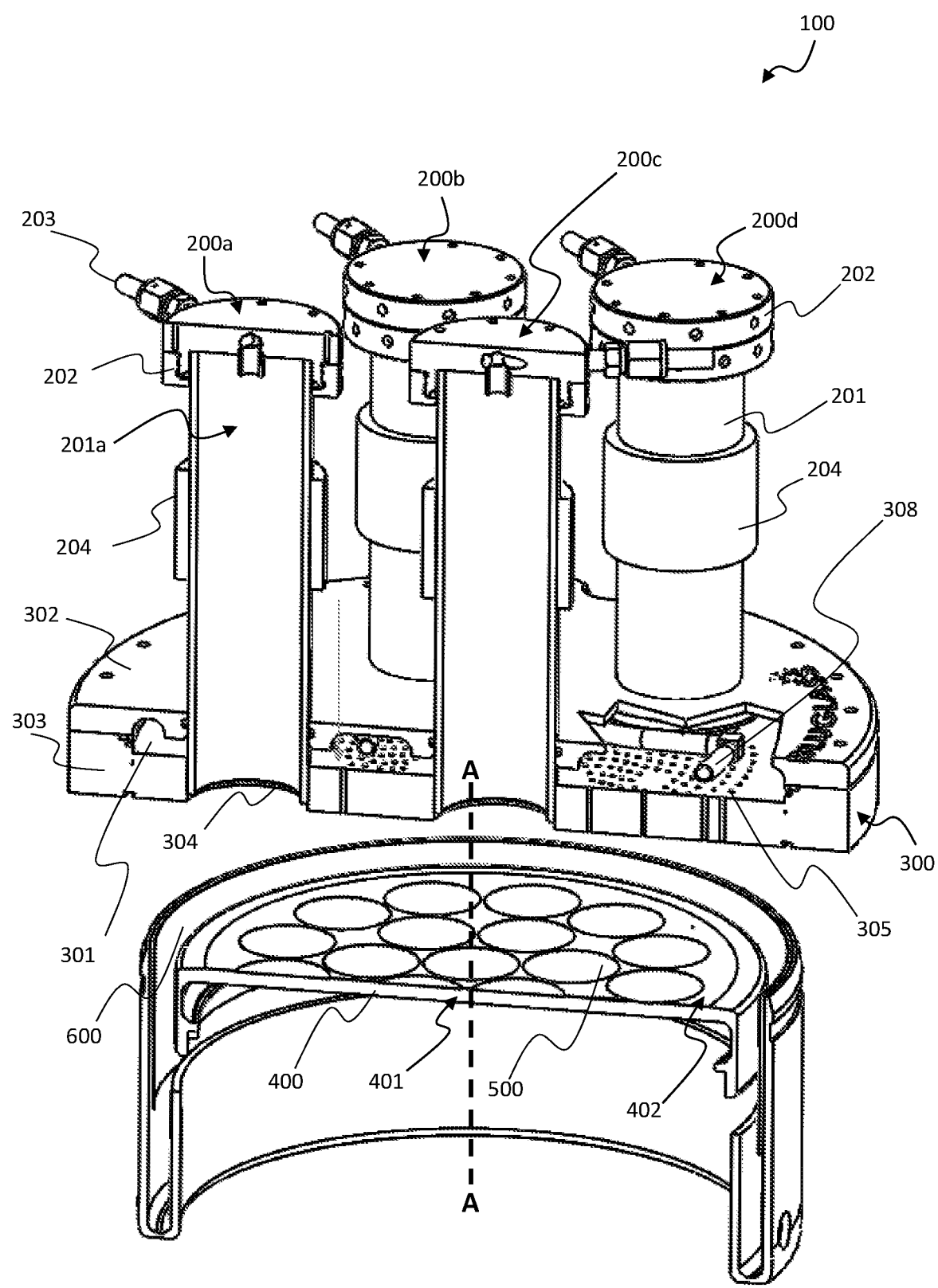
FIG. 2 shows an exploded perspective sectional view of the apparatus of FIG. 1.

Referring to FIG. 1 and FIG. 2, and as will become clearer from the below discussion, each of the plasma generators 200a-d is associated with a respective plasma inlet 304a-d of a showerhead 300. Each of the plasma inlets 304a-d is configured to deliver plasma into the reaction chamber 600. The plasma inlets 304a-d and plasma generators 200a-d may be configured such that each is in line of sight of the susceptor 400, and therefore one or more substrates 500 when said substrates 500 are supported on the susceptor 400. As shown in this embodiment, and with further reference to FIG. 3, each of the plasma inlets is located between a central region 306 and an outer region 307 of the showerhead 300, at a position that is off-centre from an axis of rotation (A-A).

The power used to generate the plasma may be about 500 to 5000 W, and can be combined with a gas flow (i.e., the flow of gas suitable for generation of a plasma) of about 1000-3000 sccm, for example.

The plasma gas port 203 of each plasma generator 200a-d is connected to a gas supply comprising at least one gas suitable for generation of a plasma. In some embodiments, the supplied gas comprises a Group VA element, and the plasma generated is a Group VA plasma. For example, the supplied gas may comprise nitrogen ($N_2$), and/or oxygen ($O_2$), and/or ammonia ($NH_3$), and/or helium (He), and/or Argon (Ar) gas, or any mixture thereof. In a preferred embodiment the supplied gas includes nitrogen gas and, as such, the generated plasma is a nitrogen plasma comprising active nitrogen species. Subsequent discussion refers to plasma as being a nitrogen plasma comprising active nitrogen species. However, it will be appreciated by a skilled addressee that the plasma may comprise a mixture of gases.

FIG. 2 shows a perspective exploded view of the embodiment of FIG. 1. As seen, the susceptor 400 of the RPCVD apparatus 100 is configured to support one or more substrates 500 in a reaction chamber 600. The one or more substrates 500 are located at a surface of the susceptor 400 between a central region 401 and an outer region 402 of the susceptor 400. The apparatus 100 is configured such that the susceptor 400 is able to rotate relative to the showerhead 300 around an axis of rotation (A-A). The susceptor 400 is adapted such that during the rotation the substrates 500 remain supported by the susceptor 400, on the surface of the susceptor 400.

The susceptor (400) may support one or more substrates 500 distributed in any pattern. The substrates may be all of equal diameter. Alternatively, at least one of the substrates in a plurality of substrates may have a different diameter. The substrates may be formed of a material having a crystalline structure what is suitable for growth of a film. The one or more substrates may be suitable for growth of metal nitride films. The one or more substrates may be suitable for growth of a gallium containing metal nitride film. For at least two substrates, each of the substrates may be made from the same material, or of different, materials.

The susceptor may be configured to rotate at a rate sufficient for the growth/deposition of at least one monolayer of film, at least two monolayers of film, or more monolayers of film, on the surface of a substrate for a full rotation of the susceptor. The speed of the rotation of the susceptor may depend on the growth rate of the film. In some embodiments, the susceptor may rotate at a speed between 30 and 90 revolutions per minute (rpm), for example.

As illustrated in FIGS. 1 and 2, the showerhead 300 is provided with at least one gas chamber 301. The at least one gas chamber is formed between a showerhead upper portion 302 and an, opposing, showerhead lower portion 303. The showerhead lower portion 303 is adjacent the reaction chamber 600. The at least one gas chamber 301 comprises at least one reagent port 308 for introducing at least one reagent gas into the at least one gas chamber 301.

The reagent gas supplied by the at least one reagent port 308 comprises at least one gas able to undergo chemical reactions for the production, growth, deposition, or otherwise formation of thin films on the surface of the one or more substrates 500 in the reaction chamber 600. The at least one reagent gas may comprise a metal organic (MO) reagent selected from Group IIA metal organic reagents, or Group IIIA metal organic reagents. For example, the at least one reagent gas may comprise a gallium containing metal organic reagent, such as trimethylgallium. The gas supplied by the at least one reagent port 308 may comprise at least one non-reactive gas, and/or at least one inert gas, and/or at least one carrier gas.

As illustrated in FIGS. 1 and 2, and discussed in more detail below, the showerhead 300 is provided with a plurality of gas inlets 305 distributed in a pattern on the showerhead lower portion 303 of the showerhead 300. The gas inlets 305 are configured to deliver the gas from the at least one gas chamber 301 into the reaction chamber 600.

In preferred embodiments, active nitrogen species derived from nitrogen plasma generated in at least one plasma generator 200 reacts with the at least one metal organic (MO) in the reaction chamber 600, so as to deposit, grow, or otherwise form, a film on the one or more substrates 500 within the reaction chamber 600. Preferably, the film is a metal or metalloid containing film, such as a gallium nitride (GaN) film. Subsequent discussion refers to gas comprising a metal-organic (MO) reagent as an example of a reagent gas, or reagent containing gas.

According to some embodiments of the present disclosure, at least one additional reagent port may be provided. The at least one additional reagent port may introduce at least one additional gas to the gas chamber. The additional gas may comprise at least one reactive gas, and/or at least one non-reactive gas, and/or at least one inert gas, and/or at least one carrier gas. For example, the additional gas may be a reactive gas consisting of ammonia ($NH_3$).

Figure 3:
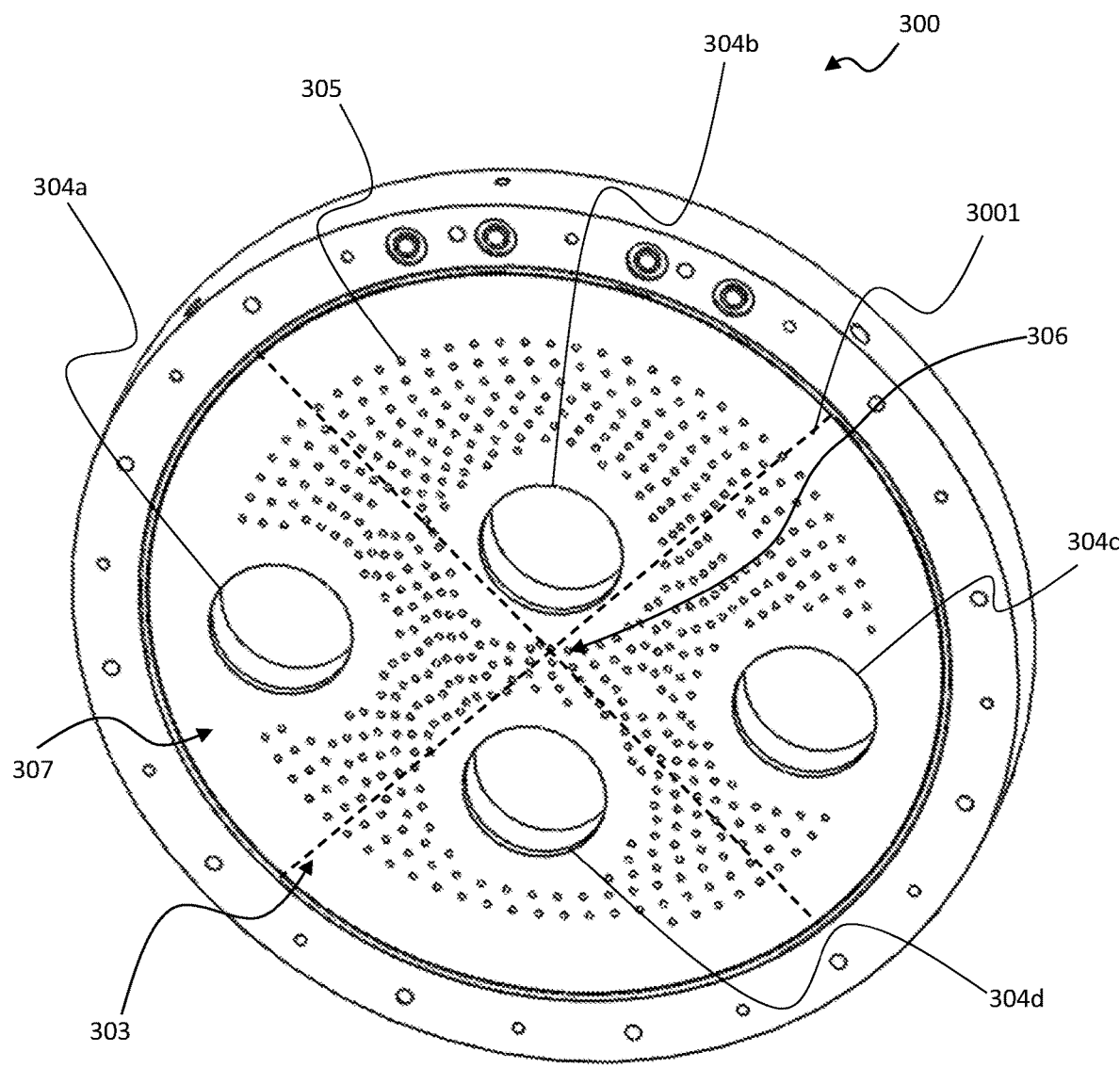
FIG. 3 shows a perspective bottom view of a showerhead of the apparatus of FIG. 1.

FIG. 3 shows a perspective view of the showerhead 300 including the plurality of plasma inlets 304a-d, and the plurality of gas inlets 305 distributed in a pattern in the lower portion 303 of the showerhead between the central region 306 and the outer region 307 of the showerhead 300. The gas inlets 305 are distributed in a pattern so that they surround significant portions of the circumference of the plasma inlets 304a-d (e.g. at least half or three quarters of the circumference). In this embodiment, two of the plasma inlets 304b-c are completely surrounded by gas inlets 305.

Each of the plasma inlets 304a-d are configured to deliver plasma from the showerhead 300 into the reaction chamber 600. Each plasma inlet 304 is associated with a respective plasma generator 200. In this embodiment, the plasma inlets each have an opening with a maximum diameter that is greater than the maximum diameter of the opening of each gas inlet 305. In this embodiment, the maximum diameter of the opening of each plasma inlet is more than 50× the maximum diameter of the opening of each gas inlet. The inlets may be configured with openings of other relative diameters (and corresponding areas), in accordance with preceding discussions.

Each of the plasma inlets 304 directs plasma having a respective spatial distribution of plasma intensity at the surface of the susceptor 400. In this embodiment, the plasma inlets 304 are configured such that a combination of all of the spatial distributions of plasma intensity provides a substantially uniform distribution of plasma density, i.e., plasma flux per unit area, at the surface of the susceptor 400 between the central region 401 and the outer region 402 of the susceptor 400 following a full rotation of the susceptor (400).

In this embodiment, the plasma inlets 304 are distributed in a non-uniform, non-radially symmetric pattern at the showerhead 300, albeit in alternative embodiments plasma inlets may be provided that are distributed in a partly or completely uniform pattern or otherwise.

The apparatus 100 may further comprise a controller (not shown) to individually control the plasma intensity, and in some instances therefore the spatial distribution of plasma intensity, directed from for one or more of the plasma inlets 304. For example, the controller may adjust a gas flow from the gas source at the gas port 203 of at least one plasma generator 200. In another example, the controller may, additionally or alternatively, adjust a power supplied by the ionising region 204 of at least one plasma generator 200 and, therefore, adjust the power of the generated plasma (i.e., plasma power).

In this manner, in some embodiments the showerhead may have one or more plasma inlets towards the outer region of the showerhead that are configured to direct plasma of higher plasma intensity than one or more plasma injectors positioned towards the central region of the showerhead.

As shown in FIG. 3, the gas inlets 305 are distributed in a pattern (e.g. in the form of an "array") at a surface of the showerhead 300, between a central region 306 and an outer region 307 of the showerhead 300, and around the plasma inlets 304a-d. The gas inlets 305 in this embodiment are distributed in a radially and rotationally asymmetric pattern at the surface of the showerhead.

The gas inlets 305 are distributed over a major part of the surface of the showerhead 300 and in this example over more than 50% of the area of surface of the showerhead between the central region 306 and outer region 307 of the showerhead 300. As can be seen, when the surface of the showerhead 300 is divided into any four notional quadrants, e.g. as represented by crossed dotted lines 3001 in FIG. 3, the gas inlets are distributed in all 4 of the quadrants in this embodiment. Moreover, if the surface of the showerhead were divided into four concentric notional rings of equal width between the central region 306 and outer region 307 (the rings not being identified in FIG. 3), the gas inlets would be seen to be distributed all 4 of the rings in this embodiment.

Each of the gas inlets 305 directs gas having a respective spatial distribution of gas at the surface of the susceptor 600. In preferred embodiments, the pattern, or arrangement, of gas inlets is such that a combination of all of the spatial distributions of gas from the array of gas inlets provides a uniform distribution of gas density (i.e., flux per unit area) on the surface of the susceptor between a central region and an outer region of the susceptor, for a full rotation of the susceptor.

Attention now focusses on how showerheads that uses both plasma inlets and MO gas inlets are designed to achieve substantially uniform distributions of both plasma and gas density through specific positioning of plasma and gas inlets on the surface of the showerhead, while also utilising the rotation of the susceptor, e.g. in accordance with the showerhead of FIGS. 1 to 3.

As described, a showerhead comprises both openings for the injection of plasma (plasma inlets) and of apertures for the injection of a reagent gas (gas inlets), such as a metal-organic (MO) reagent. It follows that regions where plasma inlets are placed cannot also contain gas inlets. This invokes a design constraint when considering how to best arrange the distribution of inlets, for example, by limiting the locations where the MO gas inlets can be placed. This design constraint can render commonly used injector arrangements, such as uniform grid arrays or spirals that extend substantially across the entire showerhead, inappropriate.

Figure 4:
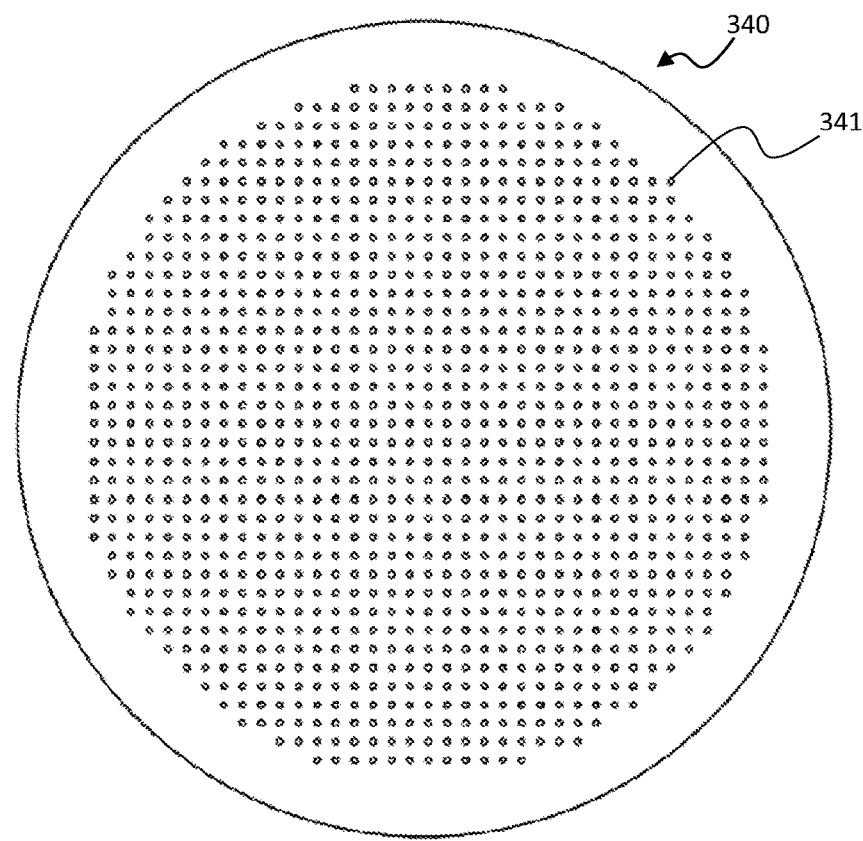
FIG. 4 shows a bottom view of a showerhead for the purpose of comparison, the showerhead having an array of gas inlets arranged in a square array.
Figure 5:
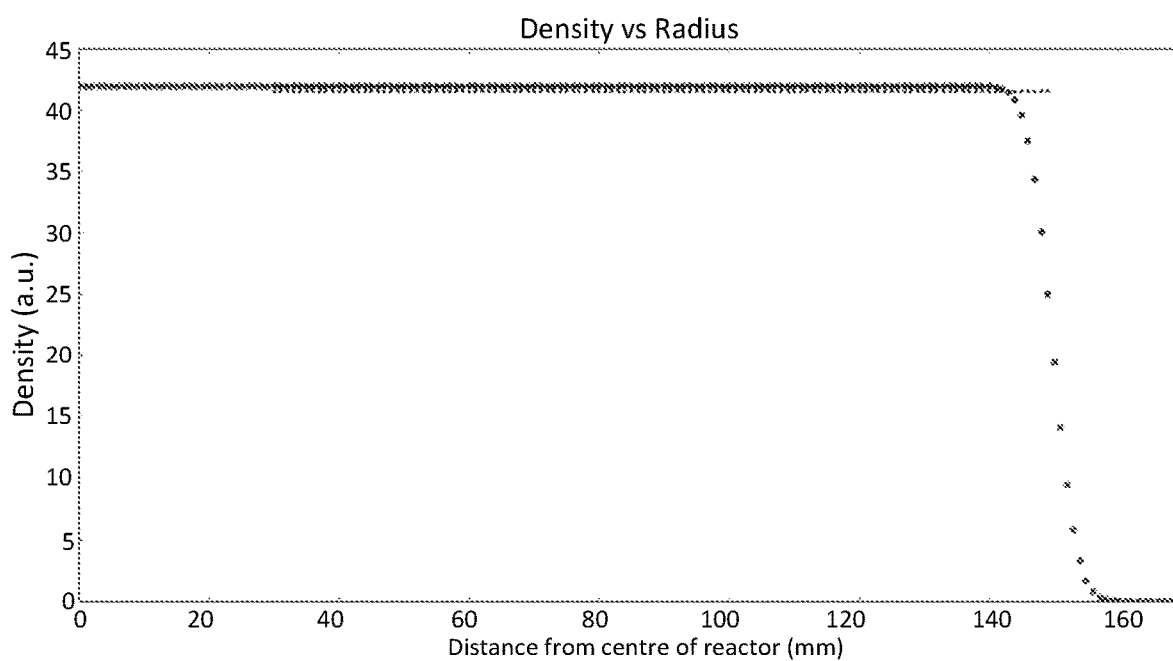
FIG. 5 shows a simulated total flux (density profile) of injected species that a susceptor is exposed to as a function of radius within a reaction chamber for the inlet arrangement of FIG. 4.

FIG. 4 shows a bottom view of a showerhead 340 for MOCVD, for the purpose of comparison. The showerhead has an array of gas inlets 341 formed by over one thousand (specifically 1101) inlets arranged in a grid with 8 mm spacing. FIG. 5 shows the simulated total flux of injected species that the susceptor is exposed to as a function of radius following a single complete rotation of the susceptor. This simulation (referred to herein as the density profile) is a projection of two-dimensional (2D) density map data from gas inlets 341 as arranged in FIG. 4 onto a single radial slice. The radial density profile is extremely uniform (flat) out to a radius of 150 mm—the radii of the outermost hole/aperture of the array of gas inlets on the surface of the showerhead. This uniformity is a result of the relatively high number of gas inlets, and their arrangement, such that the density of gas inlets (i.e., holes) per unit area is equal for all parts of the showerhead within the injected species (injector matrix).

Figure 6:
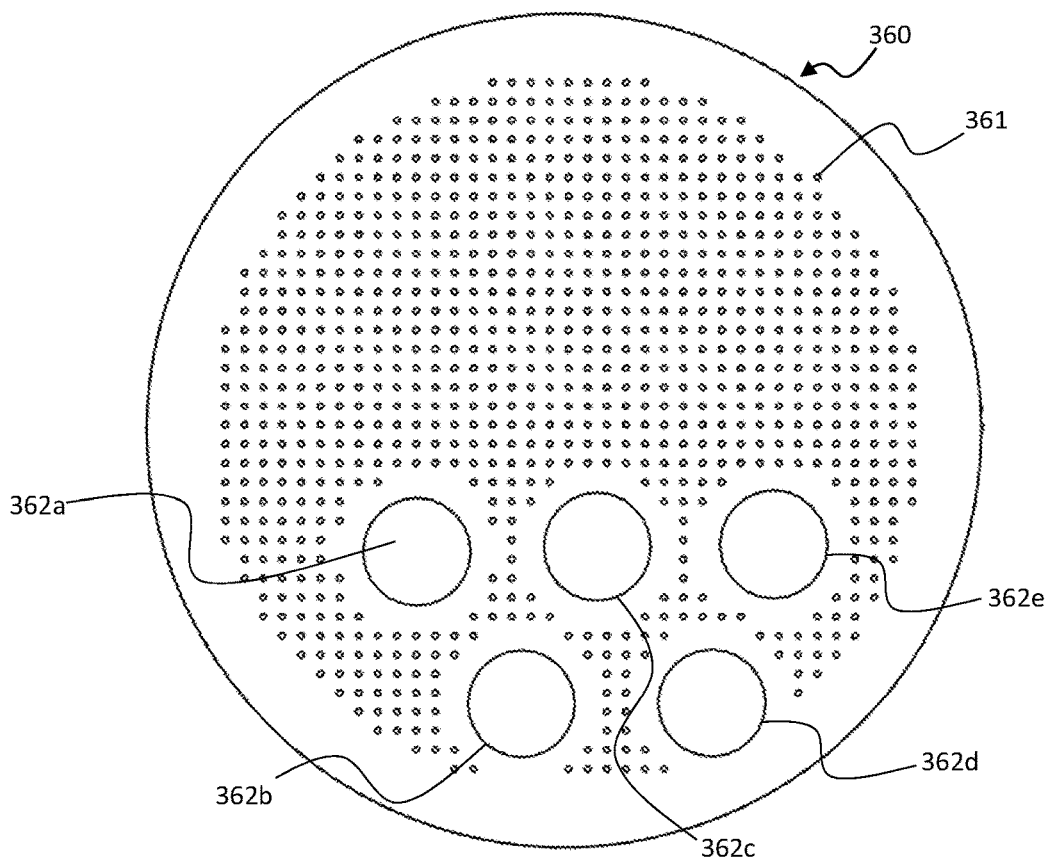
FIG. 6 shows a bottom view of a showerhead for the purpose of comparison having the same square array of gas inlets as FIG. 4, but with certain gas inlets of the array removed in place of larger plasma inlets.
Figure 7:
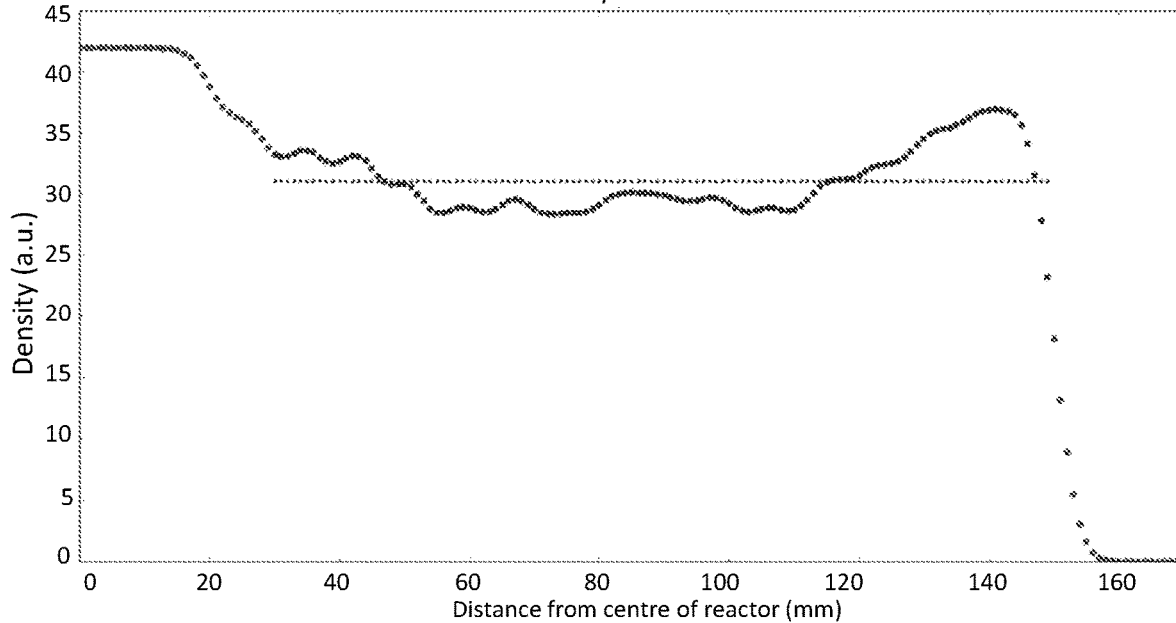
FIG. 7 shows a simulated total flux (density profile) of injected species that a susceptor is exposed to as a function of radius within a reaction chamber for the inlet arrangement of FIG. 6.

FIG. 6 shows a bottom view of a showerhead 360 having the same square array of gas inlets 361 as the embodiment of FIG. 4, but with certain gas inlets removed for placement of five, larger, plasma inlets 362a-e. FIG. 7 shows the simulated total flux (density profile) of injected species a susceptor is exposed to as a function of radius within a reaction chamber for the inlet arrangement of FIG. 6. As seen, the radial density profile is substantially non-uniform across the surface of the susceptor. In contrast, the corresponding grid arrangement which was uninhibited by the placement of plasma inlets (i.e., that of FIG. 4) exhibited a highly uniform density profile out to a radius of 150 mm. Accordingly, simple removal of gas inlets to make space for plasma inlets is inappropriate for RPCVD. The inventors have realised that the mere removal of gas inlets prevents there being an equal density of gas inlets per unit area, leading to a highly non-uniform density profile at the susceptor.

A commonly employed alternative to the above-mentioned grid arrangement to achieve a uniform density profile of reagent gas (such as MO gas) is to use a spiral arrangement of gas inlets (injectors). A key feature of a spiral arrangement that differentiates it from a grid arrangement is that no two injectors are located at the same radii. In such an arrangement, the density profile at the surface of a susceptor will be uniform only after a complete rotation of the susceptor. This is because every gas inlet in the gas inlet array must contribute to the density profile in order to achieve the uniformity.

Figure 8:
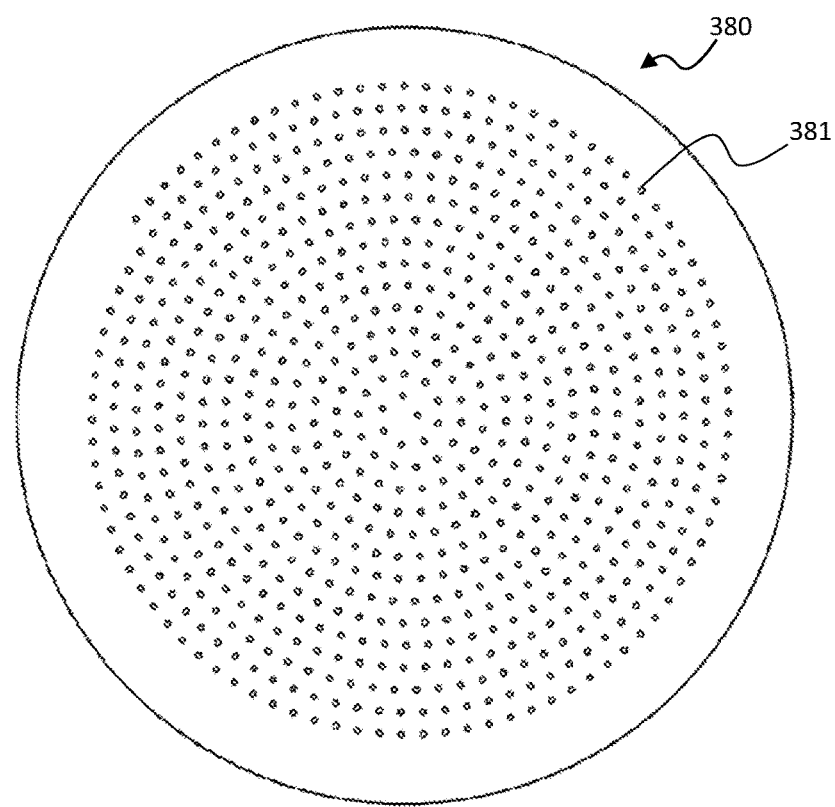
FIG. 8 shows a bottom view of a showerhead for the purpose of comparison having an array of gas inlets arranged in a spiral array.
Figure 9:
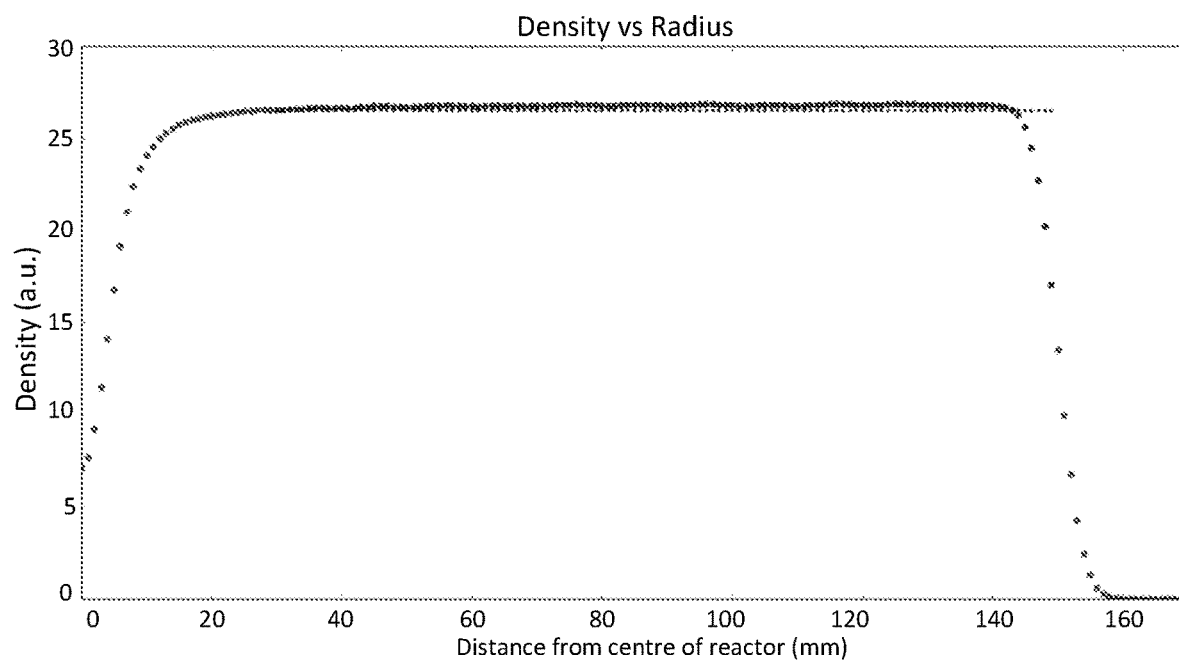
FIG. 9 shows a simulated total flux (density profile) of injected species that a susceptor is exposed to as a function of radius within a reaction chamber for the inlet arrangement of FIG. 8.

FIG. 8 shows a bottom view of a showerhead 380 having an array of gas inlets 381 arranged in a spiral array (705 gas inlets). FIG. 9 shows the corresponding simulated total flux (density profile) of injected species that a susceptor is exposed to as a function of radius within a reaction chamber for this pattern of gas inlets 381. As seen, the inlet arrangement of FIG. 8 results in a highly uniform density across the surface of the susceptor out to 150 mm radius from the centre of the reaction chamber. It is noted that the uniformity becomes non-uniform and the density decreases towards the centre of the reactor, i.e., at radial distances of less than approximately 30 mm from the centre of the reactor. This is due to the reduced number of gas inlets, meaning the separation between neighbouring gas inlets becomes large relative to the dispersion of the flux being delivered by each individual gas inlet.

Figure 10:
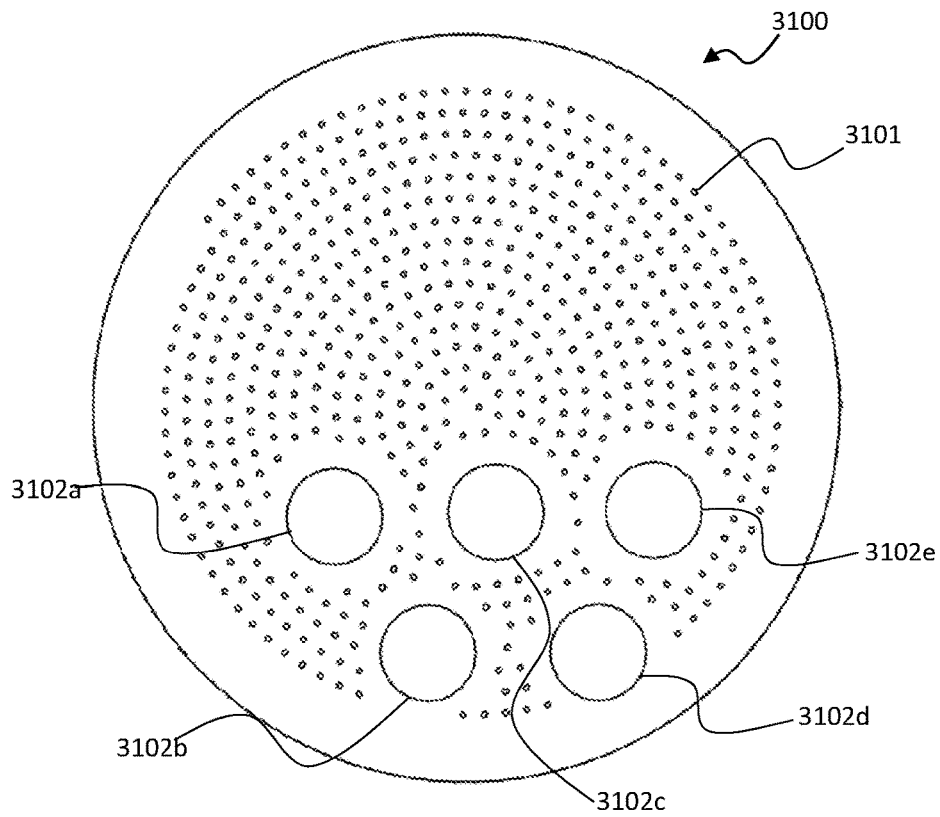
FIG. 10 shows a bottom view of a showerhead for the purpose of comparison having certain gas inlets of the array removed in place of larger plasma inlets.
Figure 11:
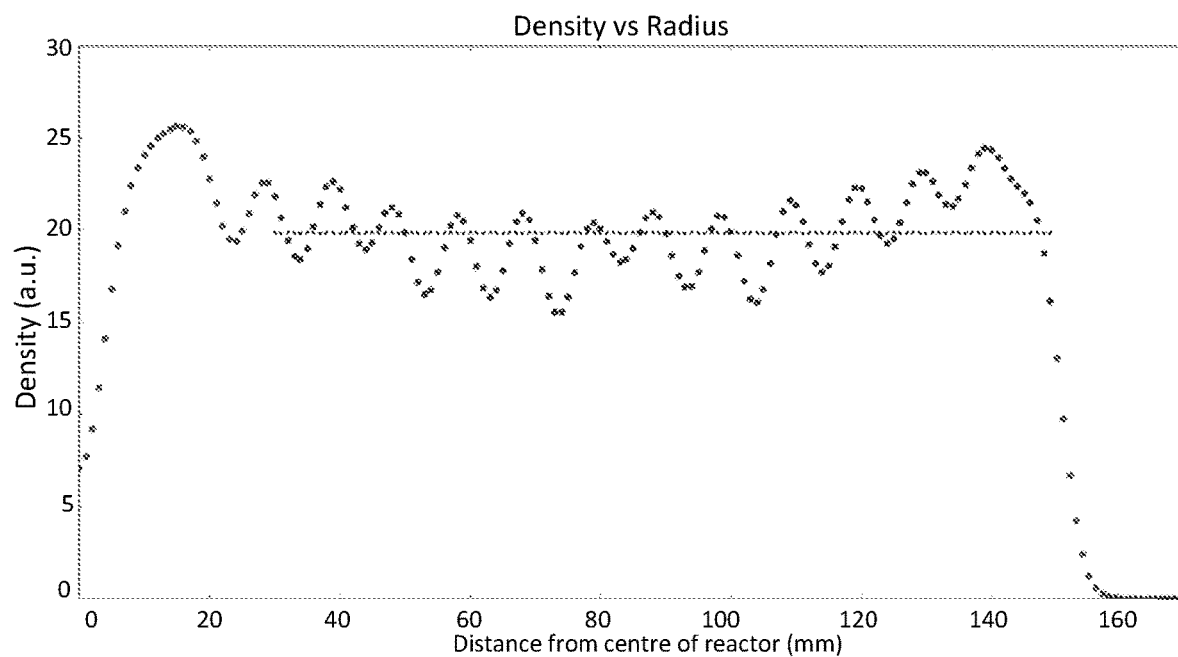
FIG. 11 shows a simulated total flux (density profile) of injected species that a susceptor is exposed to as a function of radius within a reaction chamber for the gas inlet arrangement of FIG. 10.

The present inventors have found that the spiral arrangement (distribution) of gas inlets (i.e., like the example pattern of FIG. 8), is also not immune to the problem of removing gas inlets in order to make space for the placement of plasma inlets in a showerhead. FIG. 10 shows a showerhead 3100 having an exemplary spiral array arrangement of gas inlets 3101. The array of gas inlets comprises 541 apertures/openings, similar to that shown in FIG. 8, but with certain gas inlets removed in the array in order to allow for placement of five, larger, plasma inlets 3102a-e. FIG. 11 shows a simulated total flux (density profile) of injected species a susceptor is exposed to as a function of radius within a reaction chamber for the inlet arrangement of FIG. 10. Similar to the above-mentioned grid array, this demonstrates that for a full rotation of the susceptor, the removal of gas inlets yields a highly non-uniform density profile of injected species at the susceptor.

However, as will be explained below, the present inventors have found that an array of gas inlets distributed in a spiral pattern is more amenable to adjustments in the distribution of gas inlets in order to compensate for the placement of a plurality of plasma inlets.

In both design arrangements of gas inlets (i.e., a square (grid) arrangement or spiral arrangement), the density uniformity ultimately comes from the fact that the flux exiting a single inlet disperses and spreads out as it enters the reactor. As consequence, a single point within the reaction chamber can simultaneously receive a contribution of flux from more than one gas inlet. The present inventors discovered that for a smaller number of inlets per unit area, undulations in the density profile will emerge. This is because the dispersion will not be sufficient to compensate for the locations that lie beneath a region of a showerhead where no inlet is located.

In a (square) grid array of gas inlets there will exist multiple gas inlets located at the same radii. Therefore, through a relative rotation of the showerhead and the susceptor, the difference in density associated with these radial locations and radial locations where no inlets are located will be larger, when compared to different radial locations of a spiral array since no two inlets will be located at the same radii. In this regard, the present inventors have realised that a spiral array is more favourable to adjustment of gas inlet positioning to make space for plasma inlets, since no two inlets are located at the same radii.

By leveraging such properties of spiral arrays or other non-uniform arrays, and as evident from the subsequent discussions, the present disclosure provides for a design of a showerhead comprising both a plurality of gas inlets and a plurality of plasma inlets that maintains uniform density profiles at the susceptor. By combining certain distributions of plasma inlets and gas inlets with a full rotation of the susceptor, a combination of all of the spatial distributions of plasma intensity from the plasma inlets and gas intensity from the gas inlets can provide a density of active species arriving at the surface of the susceptor such that a complete rotation of the susceptor results in a substantially uniform growth profile at the substrate (e.g., growth surface).

In the following discussion, a process of designing a showerhead according to an embodiment of the present disclosure, having an array of gas inlets distributed on the surface of a showerhead that also comprises a plurality of plasma inlets, and which can maintain a uniform gas density profile from the gas inlets, is described with reference to FIGS. 8 to 13.

In this regard, the distribution of gas inlets of FIG. 8 is used a basis (i.e., a starting point), the gas inlets being distributed in a simple spiral arrangement. With reference to FIG. 10, gas inlets are removed to make space for 5 plasma inlets 902a-c placed (located) on the surface of the showerhead. Similar to the result discussed with respect to FIGS. 5 and 6, removing the gas inlets results in a highly non-uniform density profile of injected species, for a full rotation of the susceptor (see FIG. 11).

The present disclosure has determined that, rather than simply removing gas inlets to make space for plasma inlets, an alternative approach is to relocate those gas inlets and specifically by repositioning those gas inlets in a rotation about a central axis (see FIGS. 1 and 2 axis A-A) of the reactor to a position where no plasma inlet is provided. Thus the repositioned gas inlets may be at the same radii, but at a different location on the showerhead. As a consequence of repositioning gas inlets away from plasma inlet locations, the positioning of other gas inlets in the spiral (i.e., those not otherwise affected by the plasma inlets) may be adjusted to maintain a relatively even distribution of gas inlets across the entire surface of the showerhead.

Figure 12:
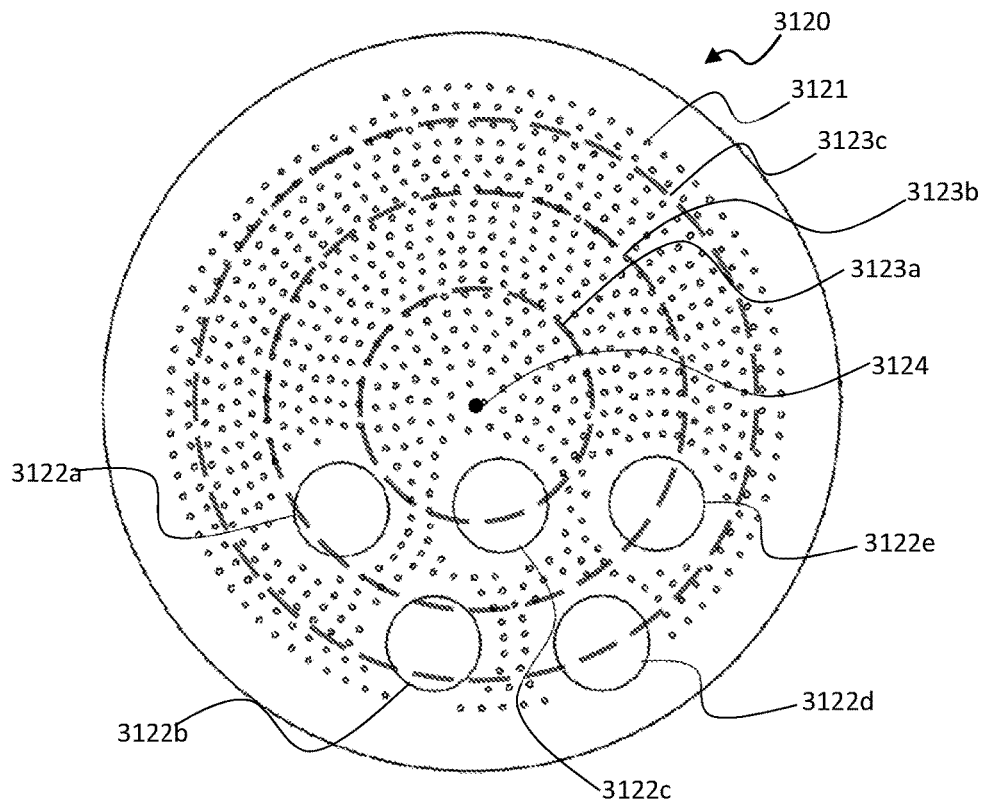
FIG. 12 shows a bottom view of a showerhead having a distribution of gas and plasma inlets according to an embodiment of the present disclosure.

An example of this solution is shown in the bottom view of a showerhead 3120 in FIG. 12. The showerhead 3120 has 5 plasma inlets 3122a-e and an array of gas inlets 3121, similar to the embodiment of FIG. 10. However, the distribution of gas inlets has been altered/adjusted for the placement of plasma inlets, in accordance with the above-mentioned rotational displacement process.

Figure 13:
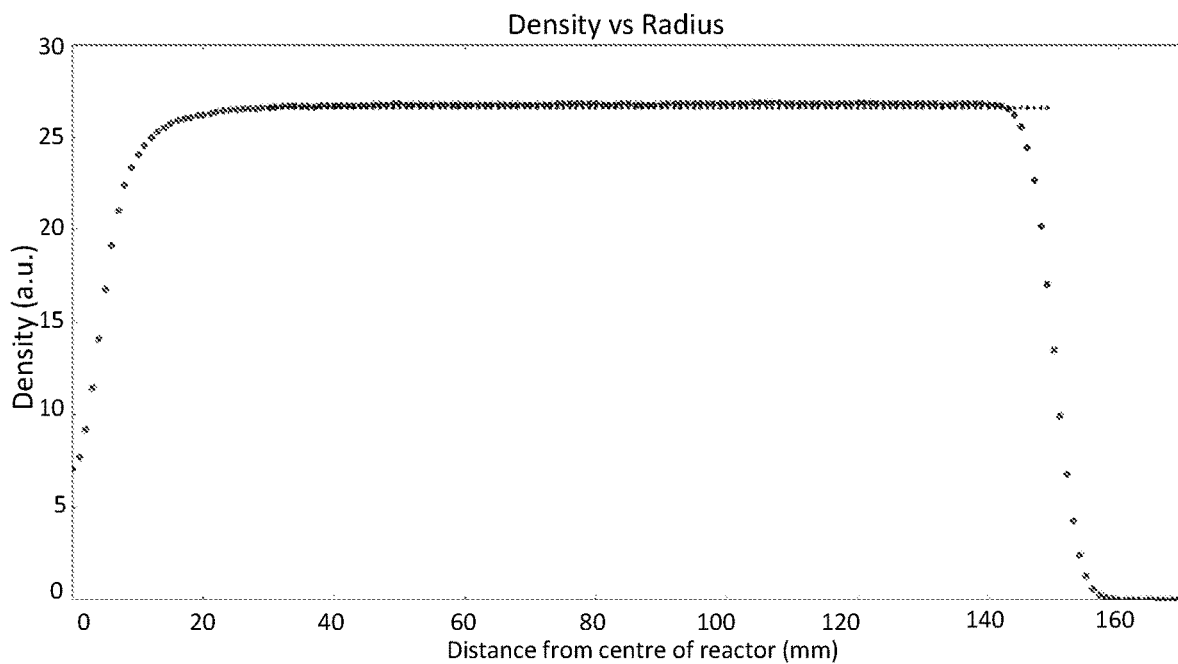
FIG. 13 shows a simulated total flux (density profile) of injected species that a susceptor is exposed to as a function of radius within a reaction chamber for the gas inlet arrangement shown in FIG. 12.

The present inventors found that this rotational alteration process can achieve a gas inlet arrangement yielding a density profile of injected species which closely resembles the density profile of the original, uninhibited, spiral arrangement of gas inlets. This is apparent from a comparison of the simulated density profiles shown in FIGS. 9 and 13. FIG. 13 shows a simulated total flux (density profile) of injected species that a susceptor is exposed to as a function of radius within a reaction chamber for the gas inlet arrangement shown in FIG. 12. This modified distribution of gas inlets yields substantially the same highly uniform density across the surface of the susceptor (in this embodiment from about 20 mm to about 150 mm radius from the centre of the reaction chamber), as shown in FIG. 9, for the original, uninhibited, spiral gas inlet arrangement of FIG. 8.

The approach to relocation of gas inlets described above can be applied to numerous plasma inlet configurations and placement locations. This is demonstrated by examples provided in FIGS. 14-19, discussed below.

Figure 14:
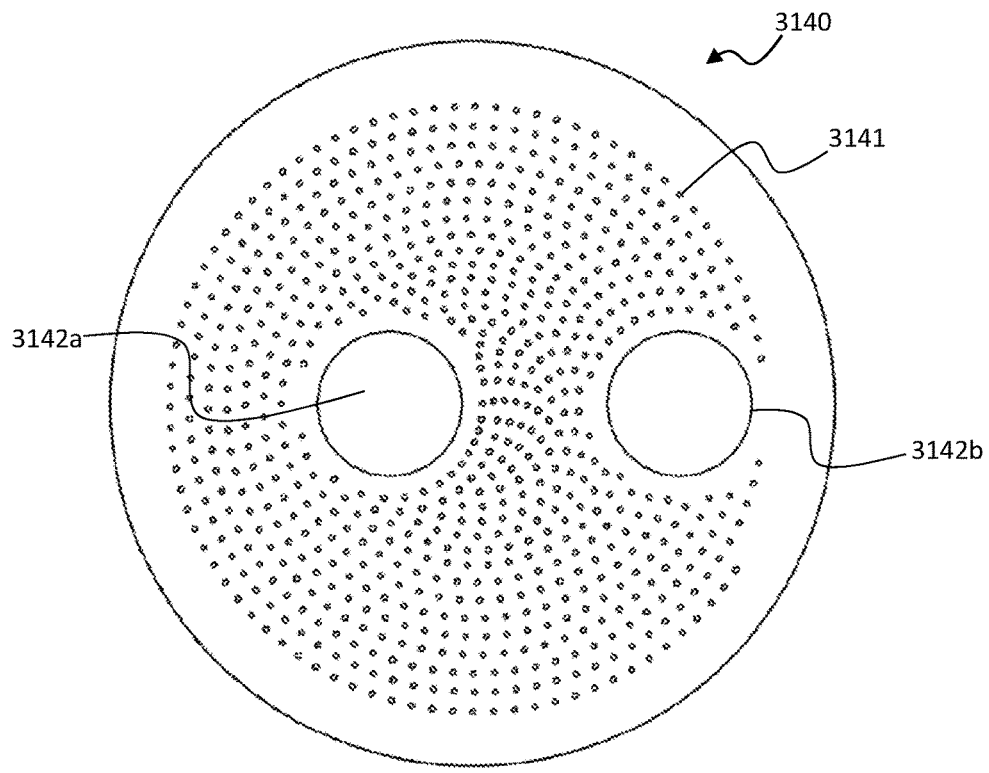
FIG. 14 shows a bottom view of a showerhead having a distribution of gas and plasma inlets according to an embodiment of the present disclosure.
Figure 15:
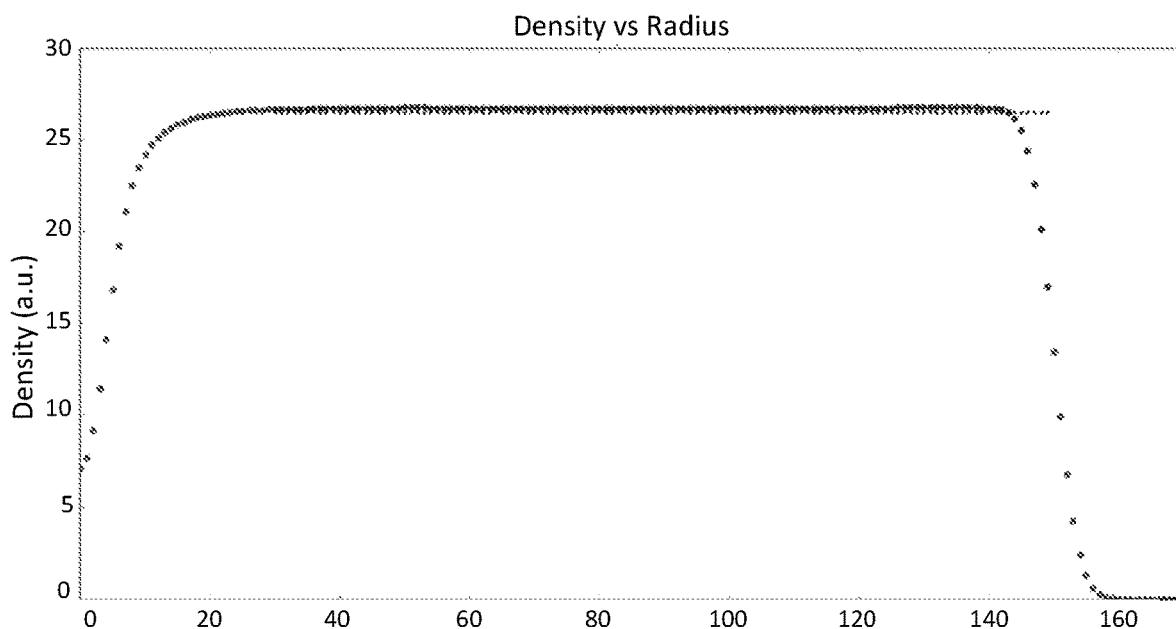
FIG. 15 shows a simulated total flux (density profile) of injected species that a susceptor is exposed to as a function of radius within a reaction chamber for the inlet arrangement shown in FIG. 14.

FIG. 14 shows a showerhead 3140 having an example modified distribution of gas inlets 3141, to allow for two plasma inlets 3142a, 3142b to be included, which are larger than those of FIG. 12 and which are located at different radii. The modified distribution is based on the same 705 gas inlet arrangement as shown in FIG. 8. The corresponding simulated density profile is shown in FIG. 15, which closely resembles the highly uniform density profile of the original, uninhibited, gas inlet pattern, as evidenced by way of comparison with FIG. 9.

Figure 16:
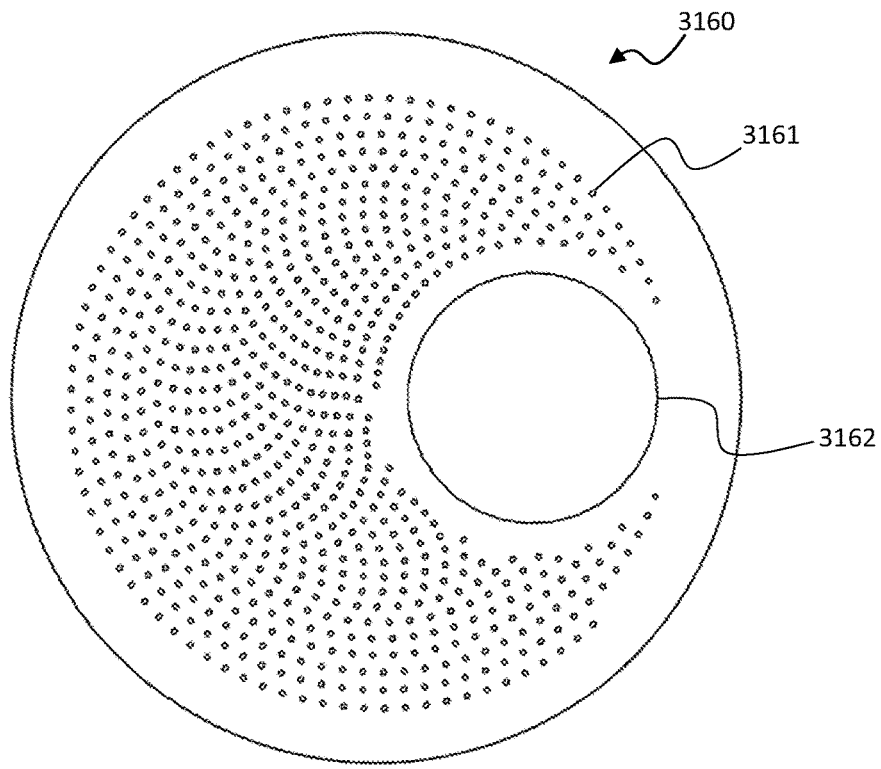
FIG. 16 shows a bottom view of a showerhead having a distribution of gas and plasma inlets according to an embodiment of the present disclosure.
Figure 17:
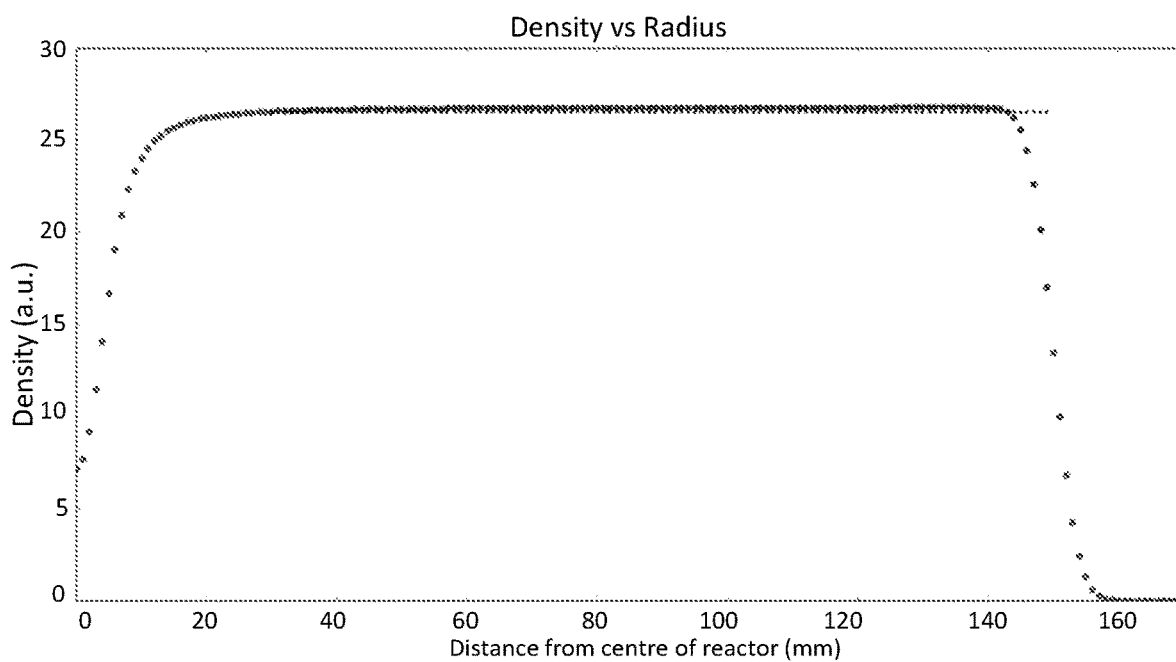
FIG. 17 shows a simulated total flux (density profile) of injected species that a susceptor is exposed to as a function of radius within a reaction chamber for the inlet arrangement shown in FIG. 16.

FIG. 16 shows a showerhead 3160 having an example modified distribution of gas inlets 3161, to allow for a single, large, plasma inlet 3162 to be included. In this example, the plasma inlet is located off-centre of the showerhead. Again, the modified distribution is based on the same 705 gas inlet arrangement as shown in FIG. 8. The corresponding simulated density profile is shown in FIG. 17, which closely resembles the highly uniform density profile of the original, uninhibited, gas inlet pattern as evidenced by way of comparison with FIG. 9.

Figure 18:
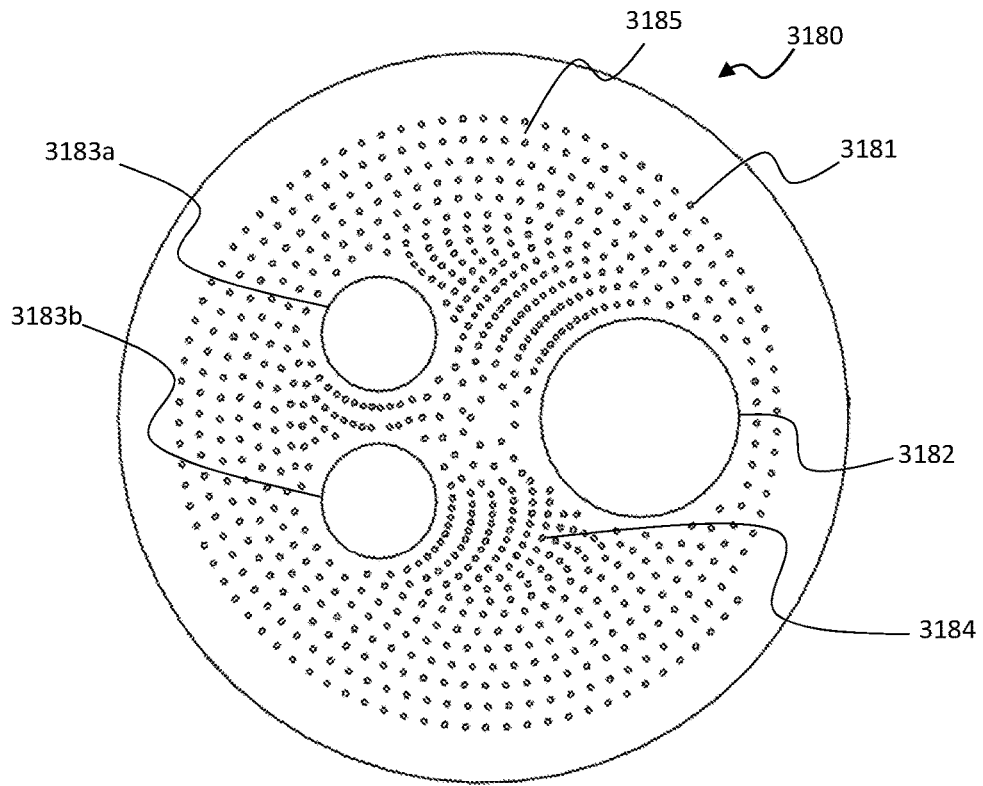
FIG. 18 shows a bottom view of a showerhead having a distribution of gas and plasma inlets according to an embodiment of the present disclosure.
Figure 19:
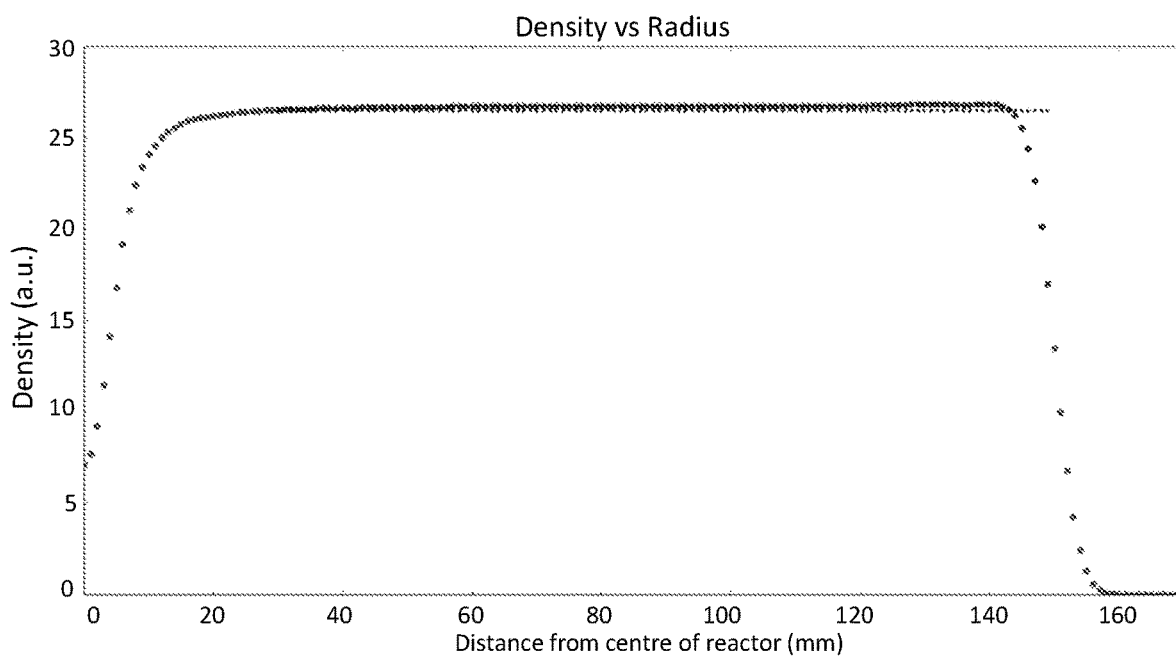
FIG. 19 shows a simulated total flux (density profile) of injected species that a susceptor is exposed to as a function of radius within a reaction chamber for the inlet arrangement shown in FIG. 18.

FIG. 18 shows a showerhead 3180 having an example modified distribution of gas inlets 3181, to allow for three plasma inlets, namely, a single, large diameter, plasma inlet 3182 and two relatively smaller plasma inlets 3183a, 3183b to be included. Again, the modified distribution is based on the same 705 gas inlet arrangement as shown in FIG. 8. The corresponding simulated density profile is shown in FIG. 19, which closely resembles the highly uniform density profile of the original, uninhibited, gas inlet pattern as evidenced by way of comparison with FIG. 9.

The present disclosure therefore provides for a showerhead that maintains a uniform density profile for the gas inlets despite being coupled with design constraints placed upon a showerhead by requiring inclusion of plasma inlets in addition to gas inlets.

Referring to FIG. 18, the gas inlets 3181 may be clustered at regions 3184 of a showerhead 3180. Clustering of the gas inlets 3181 provides space in the showerhead to accommodate the one or more plasma inlets 3182, 3183a, 3183b while retaining, for a full rotation of the susceptor, substantially the same distribution of gas density at the surface of the susceptor as if the gas inlets were uniformly distributed across the surface of the showerhead. In some embodiments, the gas inlets may be clustered at first regions of a showerhead and plasma inlets may be located at second regions of the surface of the showerhead.

In some embodiments, the average distance between gas inlets and their respective closest adjacent gas inlet is lower at or adjacent notional circular paths at the surface of the showerhead, around the axis of rotation, where plasma inlets are located (e.g. at region 3184 of FIG. 18) than at or adjacent notional circular paths at the surface of the showerhead, around the axis of rotation, where no plasma inlets or a fewer number of plasma inlets are located (e.g. at region 3185 of FIG. 18).

Figure 31:
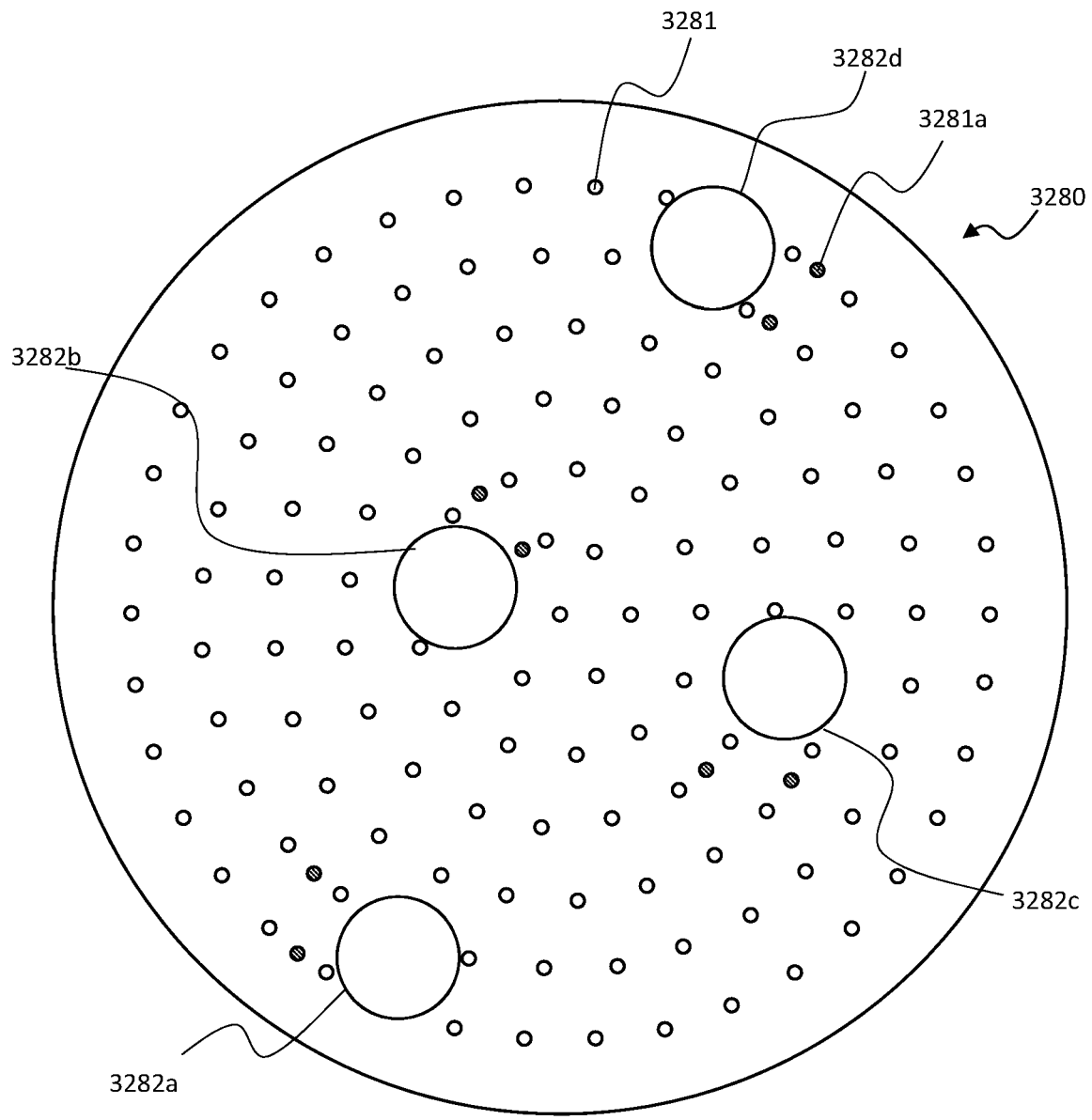
FIG. 31 shows a bottom view of a showerhead having a distribution of gas and plasma inlets according to an embodiment of the present disclosure.

In the preceding embodiments, gas inlets are distributed in augmented spiral patterns in order to accommodate plasma inlets while maintaining uniform gas density profiles. Nevertheless, other augmented patterns of gas inlets may be utilised while gaining one or more advantages of the present disclosure. Referring to FIG. 31, for example, gas inlets 3281 may in some embodiments be distributed based on an augmented uniform pattern, such as a circular array pattern that would typically deliver a uniform gas density profile. In view of the location of the relatively large plasma inlets 3282a-d, not all gas inlets 3281 can be positioned in a circular array pattern, these gas inlets 3281a being shown as shaded in FIG. 31. Similar to preceding embodiments, these gas inlets 3281a have been repositioned in the augmented pattern, but maintained at the same radii to ensure that the uniform gas density profile is maintained. The repositioning generally gives rise to clustering of gas inlets 3281, 3281a. Each repositioned gas inlet 3281a is maintained in close proximity to the associated plasma inlet (that has caused the repositioning) and preferably in a position that ensures that the repositioned gas inlets will direct gas to the susceptor immediately after direction of plasma to the susceptor from that associated plasma inlet. Thus, the substrate on the susceptor may receive its allocated gas as soon as possible, without having to wait for substantial rotation of the susceptor. A similar approach to repositioning of gas inlets has been taken in the embodiment discussed above with reference to FIG. 18.

In some embodiments, the array of the gas inlets may comprise at least a first subset of gas inlets, and a second subset of gas inlets. The gas delivered by the first subset of gas inlets may be the same as the gas delivered by the second subset of gas inlets. The gas delivered by the first subset of gas inlets may be different to the gas delivered by the second subset of gas inlets. In one embodiment, a first subset of gas inlets delivers metal organic (MO) reagent gas, and a second set of gas inlets delivers ammonia ($NH_3$) gas. Alternatively, each subset of gas inlets may comprise gas inlets delivering metal organic (MO) reagent gas and gas inlets delivering ammonia ($NH_3$) gas. The subsets of gas inlets may be configured in different zones, as discussed further below.

The present disclosure demonstrates a modification, by hole relocation, of distribution of the gas inlets that enables placement of plasma inlets while maintaining a substantially uniform density profile of gas at a surface of the susceptor. The approach can allows various arrangements (including number and size) of one or more plasma inlets to be included. Nevertheless, the plasma generator(s) and inlets should preferably be configured such that a combination of all of the spatial distributions of plasma intensity provides a substantially uniform distribution of plasma density at the surface of the susceptor between the central region and the outer region of the susceptor, for a full rotation of the susceptor.

It will be appreciated by the skilled addressee that the diameter of at least one plasma inlet may be substantially the same as another plasma inlet. In some examples, two or more of the plasma inlets have different diameters.

In some embodiments a showerhead may have more plasma inlets positioned towards the central region of the showerhead than towards the outer region of the showerhead. Alternatively, the showerhead may have more plasma inlets positioned towards the outer region of the showerhead than towards the central region of the showerhead.

According to the present disclosure, for a notional circular path on the surface of the susceptor, around the axis of rotation and between the central region and the outer region of the susceptor, the surface of the susceptor is exposed to a total plasma intensity, for a full rotation of the susceptor. The total plasma intensity may increase for increasing radial distance (r) of the circular path from the axis of rotation. For example, the increase in total plasma intensity for increasing radial distance (r) of the circular path from the axis of rotation may be proportional to r.

With reference to FIG. 12, the plasma inlets may be positioned in the showerhead such that at least one notional circular path 3123 at the showerhead, around the axis of rotation 3124, passes through only one of the plasma inlets (path 3123a), at least two of the plasma inlets (3123c), or at least three of the plasma inlets (3123b).

According to some embodiments of the present disclosure, the plasma inlets may be positioned such that at least one notional circular path at the surface of the susceptor, around the axis of rotation, is exposed to plasma directed from only one of the plurality of plasma inlets. In some examples, the plasma inlets may be positioned such that at least one notional circular path at the surface of the susceptor, around the axis of rotation, is exposed to overlapping plasma directed from at least two of the plasma inlets. In other examples, at least one notional circular path at the surface of the susceptor is exposed to overlapping plasma directed from at least three of the plasma inlets.

In some embodiments, the plasma inlets are positioned such that all notional circular paths at the surface of the susceptor, around the axis of rotation and between the central region and the outer region of the susceptor, are exposed to overlapping plasma directed from at least two of the plasma inlets.

Gas dynamics in a region around a plasma inlets will be sensitive to changes in plasma gas flow. Thus, even if locating of plasma inlets and gas inlets can be designed to produce uniform density of plasma and reagent gas at given conditions, the density profile may change when the process parameters are adjusted.

As indicated, unlike the gas inlets, the plasma inlets must typically be larger and, therefore, the number of discrete plasma inlets that can be used in a showerhead may be significantly smaller than the number of discrete gas inlets. As a result, practical constraints may make ideal placement of the plasma inlets relatively difficult (e.g. in comparison to placement of gas inlets). In some instances, there may be no perfect solution whereby the uniform density profile can be achieved simply through the geometrical location of a plurality of plasma inlets.

In order to improve the density profile when starting with an optimised, but not perfect, geometric arrangement of plasma inlets, the present disclosure recognises that controlling, adjusting, or otherwise selecting various plasma parameters, which govern the density of active nitrogen produced by each plasma inlet, can be utilised to correct for any non-uniformities in the plasma density profile that may exist. For example, plasma parameters may include flow rate of the source gas used to generate the plasma in the plasma generator and/or plasma power.

Attention now turns to the combined placement and control of plasma inlets in order to produce a uniform density profile of plasma at the surface of a susceptor for a complete rotation of the susceptor.

Figure 20:
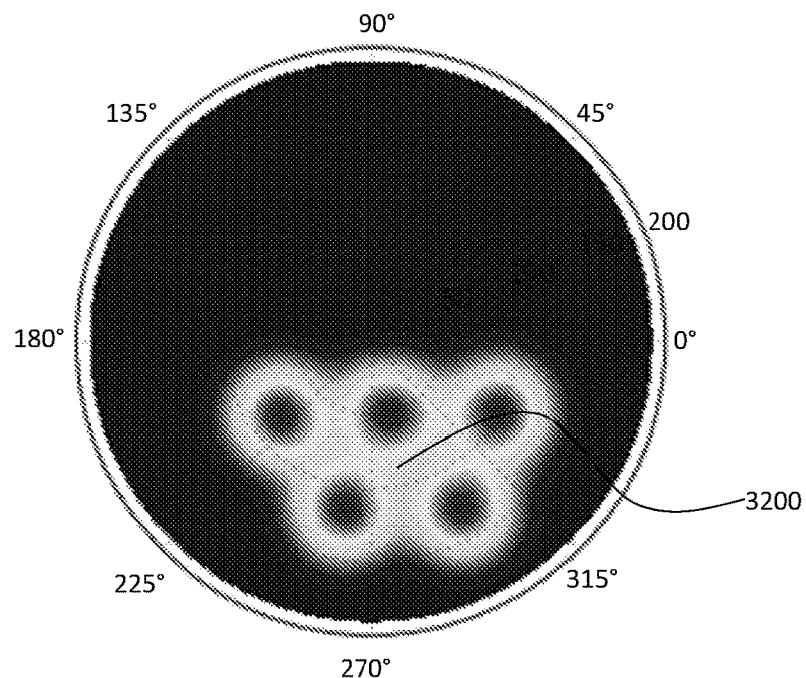
FIG. 20 shows a bottom view plasma intensity profile of a showerhead according to an embodiment of the present disclosure.
Figure 21:
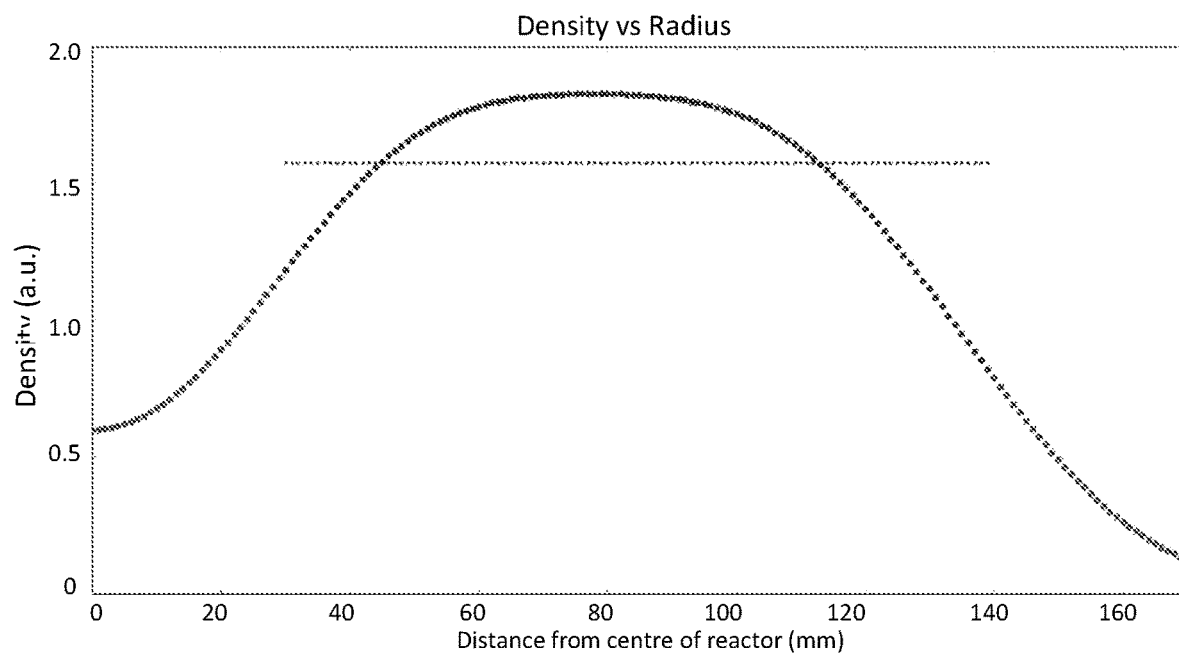
FIG. 21 shows a simulated total plasma flux (density profile) that a susceptor is exposed to as a function of radius within a reaction chamber for the plasma inlet arrangement shown in FIG. 20.

FIG. 20 shows a showerhead comprising five plasma inlets 3200. In this example, the location of the plasma inlets has been intentionally chosen to maximise the uniformity of the density profile, within the geometric and manufacturing constraints. FIG. 21 shows a simulated total plasma flux (density profile) that a susceptor is exposed to as a function of radius within a reaction chamber for the plasma inlet arrangement shown in FIG. 20. The density profile uniformity can be quantified by calculating the variance within a subregion of the reactor (a region between the central region and outer region of the susceptor) where substrates could be located. In this example, the variance of the five plasma inlet configuration is calculated to be 0.04, when each injector is driven using the same plasma parameters.

Figure 22:
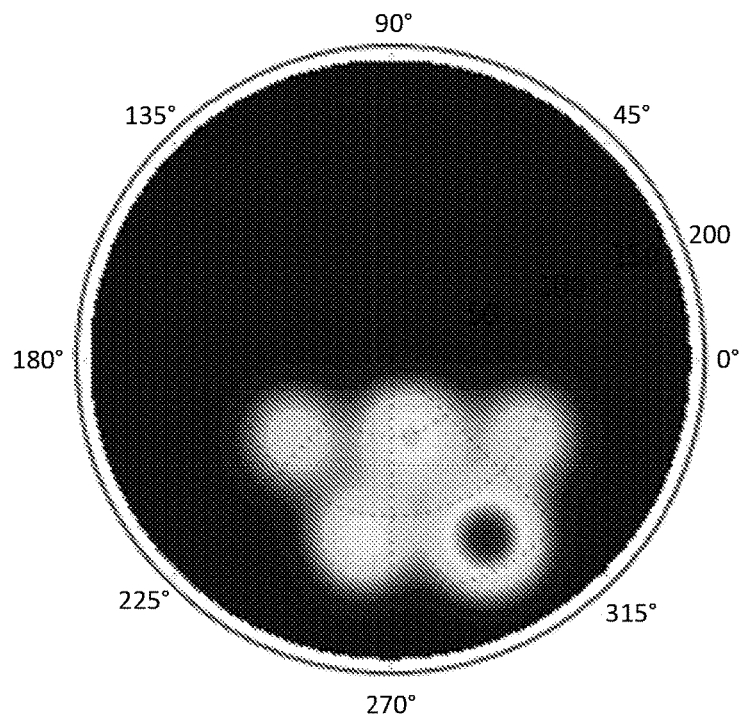
FIG. 22 shows a bottom view plasma intensity profile of a showerhead according to an embodiment of the present disclosure.
Figure 23:
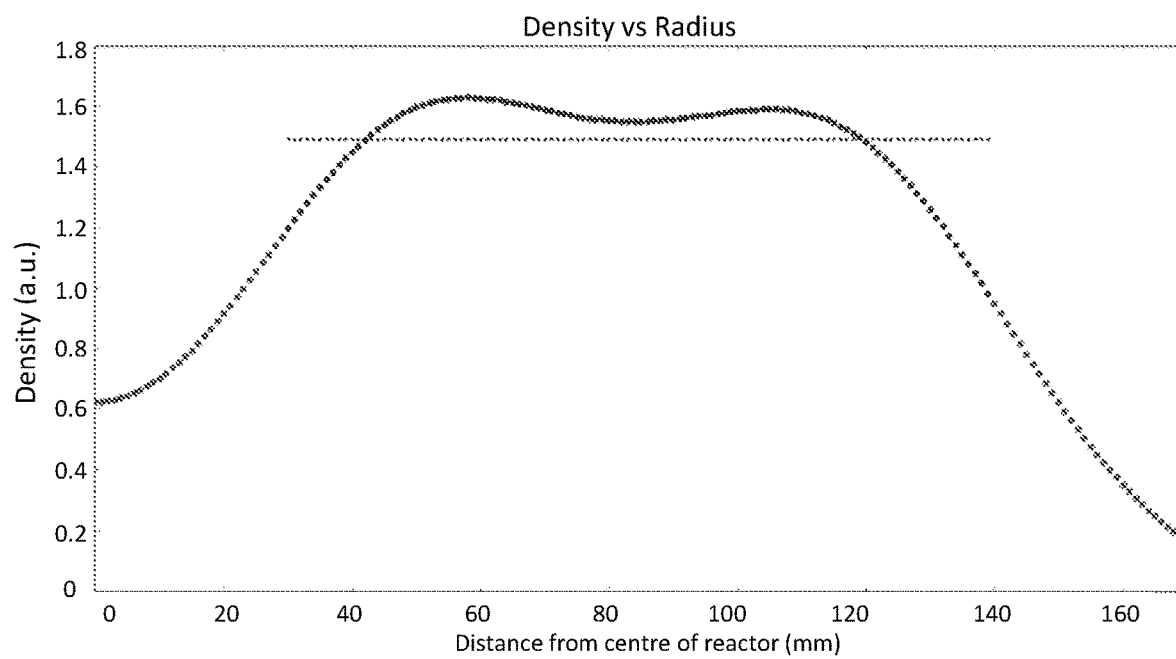
FIG. 23 shows a simulated total plasma flux (density profile) that a susceptor is exposed to as a function of radius within a reaction chamber for the plasma inlet arrangement shown in FIG. 22.

As discussed, the effective plasma density from each plasma inlet may be independently controlled by adjusting the parameters of plasma flow and plasma power, for example. Adjustment may be made independently for each plasma inlet. Consequently, the plasma density profile can be modified by changing said parameters. FIG. 22 and FIG. 23 demonstrate changes in plasma density profile, for the same five plasma inlet 3200 arrangement as illustrated in FIG. 20, when driven using different plasma parameters and through a full rotation of the susceptor. In this example, by adjusting the effective plasma density from each plasma inlet, the calculated variance within a subregion of the reactor of the plasma inlet configuration was reduced from 0.04 to 0.0155 (see FIG. 23).

Table 1 shows the relative plasma densities used for each individual plasma injector for scenario 1 (FIGS. 20 and 21) and scenario 2 (FIGS. 22 and 23).

TABLE 1

Plasma locations and individual plasma inlet densities for a five plasma injector arrangement tuned to improve density uniformity

| Relative Plasma Inlet | Relative Plasma Density (%) | |
|---|---|---|
| Location [x, y] | Scenario 1 | Scenario 2 |
| [−61.69, −50.94] | 100 | 72.6 |
| [17.84, −114.62] | 100 | 96.8 |
| [13.88, −48.83] | 100 | 104.8 |
| [61.91, −114.31] | 100 | 153.2 |
| [87.78, −47.9] | 100 | 72.6 |

In some embodiments, similar to the plasma density profile, gas density profile may also be tuned for a given distribution of gas inlets, without the requirement of modifying a reactor/apparatus design.

The technique for adjusting the plasma density profile by altering the individual plasma density from each plasma inlet may not be easily applied to the gas inlets. This can be due to the relatively small size of the apertures of the gas inlets, and large number of gas inlets in the array. For example, it may be impractical to have independent control to hundreds of small gas inlets both from a system control perspective, and also from a gas circuit perspective. The present disclosure recognises, however, that tuning of the density profile for the gas inlets may be achieved through what is described herein as "zone tuning".

Zone tuning is enabled by the grouping of injectors (gas inlets) into different subsets of gas inlets that are distributed in different zones at the surface of the showerhead, with the flux of gas through each zone being independently adjustable. Each zone contributes a different density profile of injected species. Generally the outer edges and outer shape of each zone are defined by the position of the outermost gas inlets within the respective subset. For a full rotation of a susceptor, the sum of the contribution from all zones produces the final density profile. Therefore, small adjustments to the individual contribution from each zone can yield fine tuning of the shape of the density profile. This adjustment can be used to compensate for non-uniformities, and asymmetries, in the apparatus (e.g., reaction chamber) design which affect the density profile such as asymmetries introduced by optionally having a load lock on one side, or by having perturbation of the gas flow due to the local proximity of a plasma tube and/or by the plasma flow from the plasma tubes causing perturbation of the gas flow, and/or due to different chemical/formulation properties of the gas selected for delivery.

According to the present disclosure, the gas inlets may be grouped such as to form at least 2 zones. It will be appreciated by a skilled addressee, that a showerhead may comprise more than 2 zones. The distribution of gas inlets in each of the at least 2 zones may be distributed in the same, or different, pattern of holes (injectors). In some embodiments the gas inlets of a multi-zone showerhead are distributed in a pattern which has been modified/adjusted for placement of plasma inlets.

Figure 24:
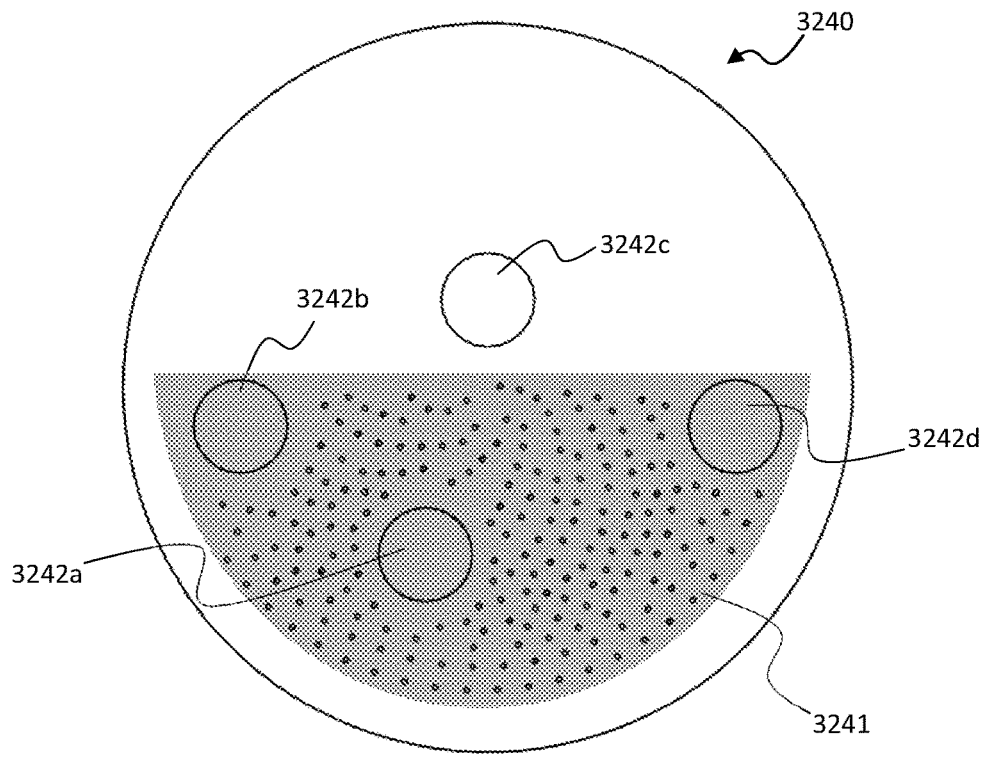
FIG. 24 shows a bottom view of Zone 1 of a 2-Zone showerhead having a distribution of gas and plasma inlets according to an embodiment of the present disclosure.
Figure 26:
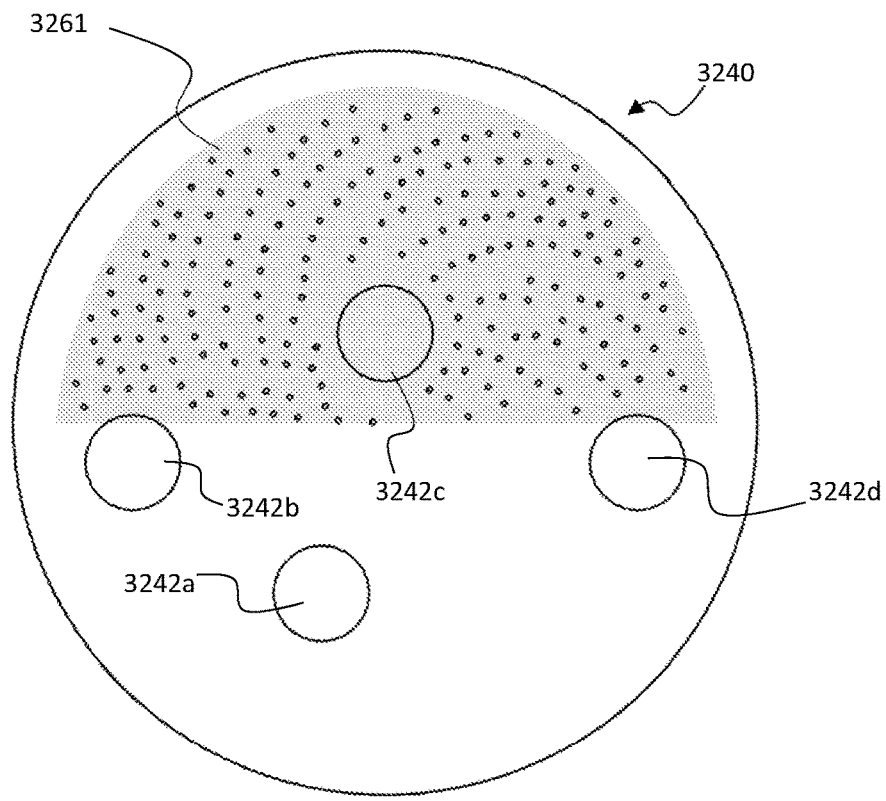
FIG. 26 shows a bottom view of Zone 2 a 2-Zone showerhead having a distribution of gas and plasma inlets according to an embodiment of the present disclosure.
Figure 28:
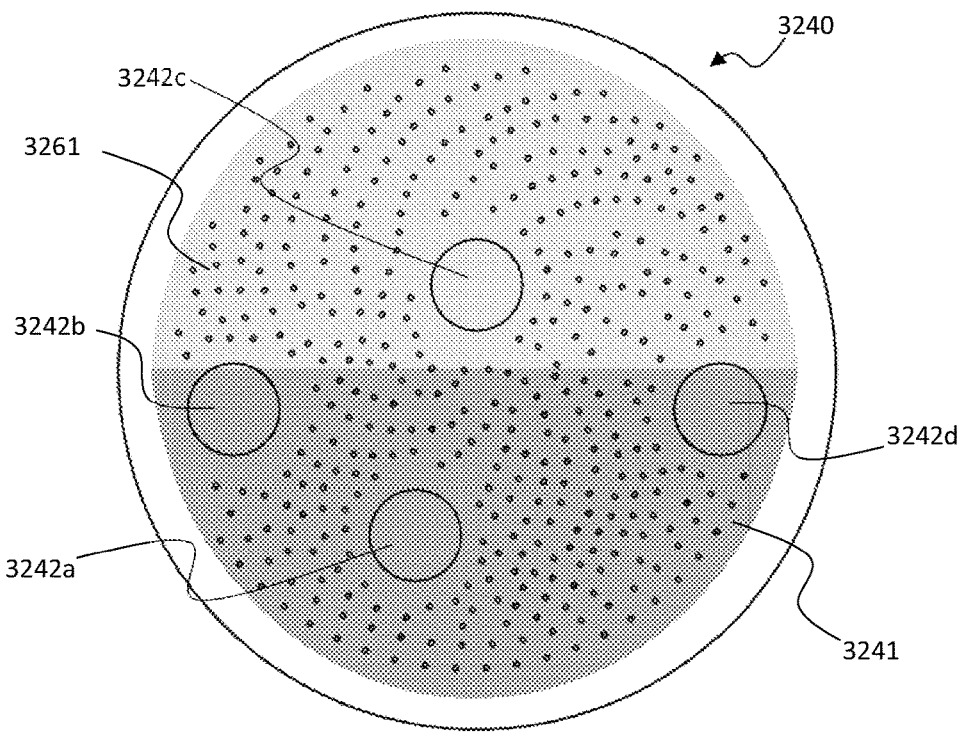
FIG. 28 shows a bottom view of both Zone 1 and Zone 2 of a 2-Zone showerhead having the inlet arrangement according to FIGS. 24 and 26.

By way of example, with reference to FIGS. 24 and 26, in one embodiment gas inlets are grouped so as to form 2 zones, therein forming a "2-zone showerhead". FIG. 24 and FIG. 26 show gas inlets grouped into Zone-1 3241 and Zone-2 3261, respectively, of a 2-zone showerhead 3240 having four plasma inlets 3242a-d. For comparison, FIG. 28 shows both zones 3241, 3261 of the 2-zone showerhead 3240. The gas inlets in each zone have their own (i.e., different) arrangement of gas inlets to accommodate differently positioned plasma inlets located within the respective zones. The independent pattern of gas inlets may allow each zone grouping of gas inlets to favour a different region of the reaction chamber, e.g. a radially outer region vs a radially inner region of the reaction chamber.

Figure 25:
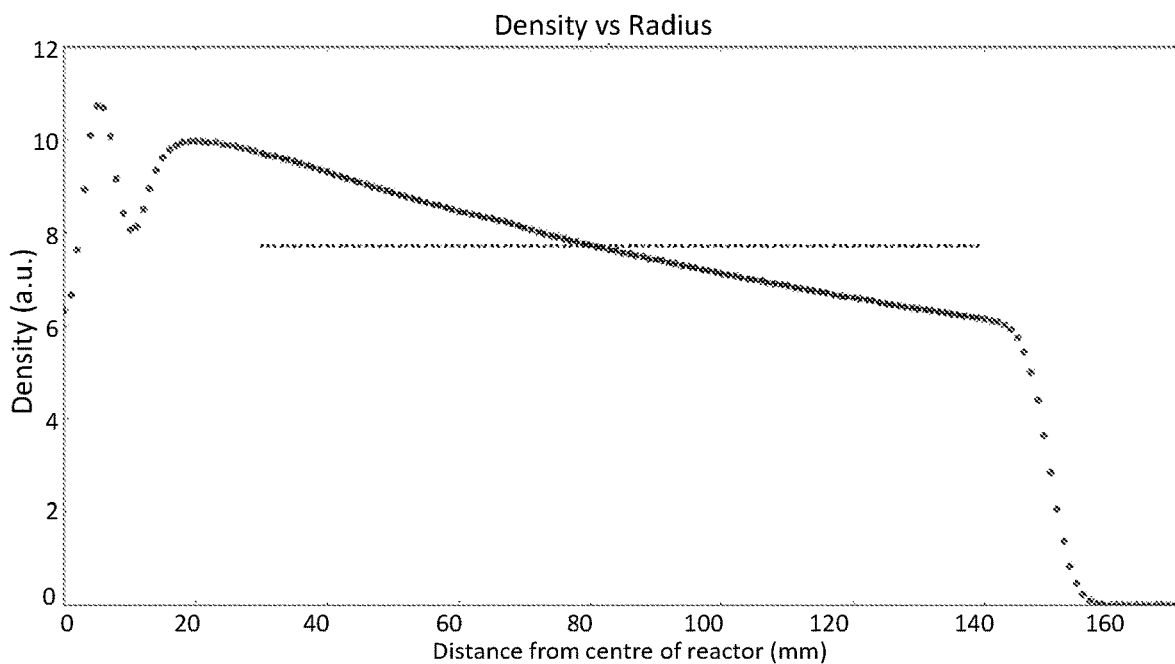
FIG. 25 shows a simulated total flux (density profile) that a susceptor is exposed to as a function of radius within a reaction chamber for the inlet arrangement shown in FIG. 24.
Figure 27:
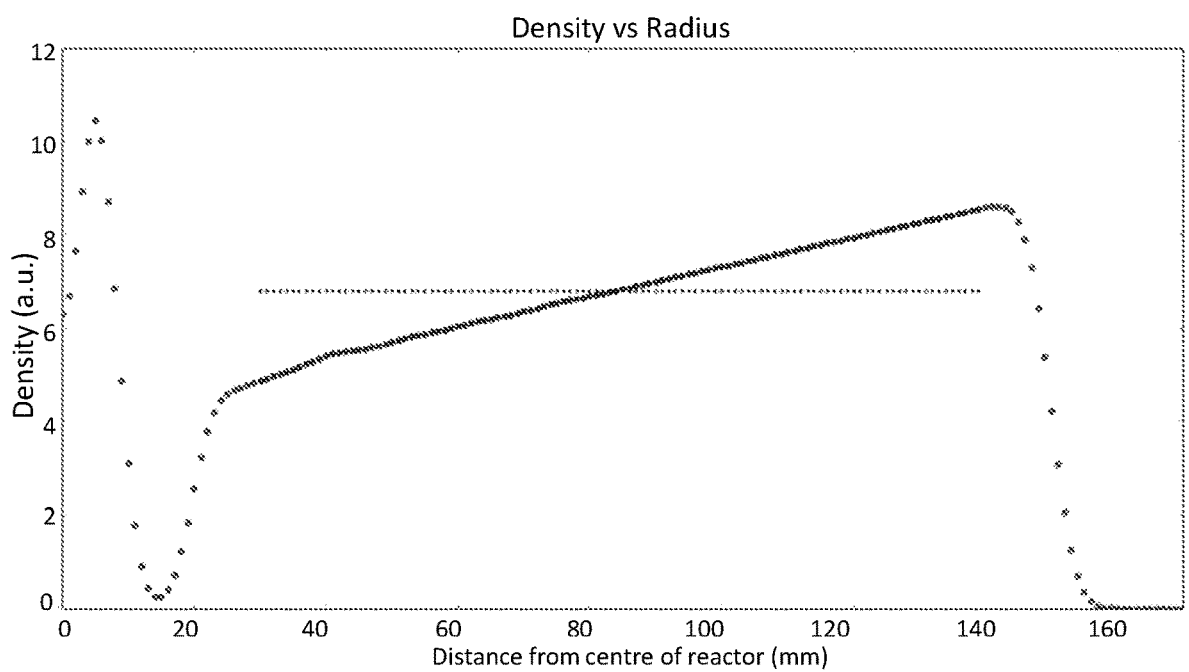
FIG. 27 shows a simulated total flux (density profile) that a susceptor is exposed to as a function of radius within a reaction chamber for the inlet arrangement shown in FIG. 26.

FIG. 24 shows that Zone-1 3241 occupies a first sector (approximately a first half) of the showerhead 3240. As shown in FIG. 25, Zone 1 favours the inner region of the showerhead such that it produces a density profile that linearly decays from the central to outer region of the showerhead. In contrast, FIG. 26 shows Zone-2 3261 of the above-mentioned exemplary 2-zone SH 3240. As most clearly seen in FIG. 28, Zone-2 3261 occupies a second sector (approximately a second half) of the showerhead 3240, opposite to Zone-1 3241. Zone-2 3261 favours the outer region of the showerhead so that it produces a density profile that linearly increases from the central to outer region of the showerhead, as shown by the simulated density profile of injector species shown in FIG. 27.

Figure 29:
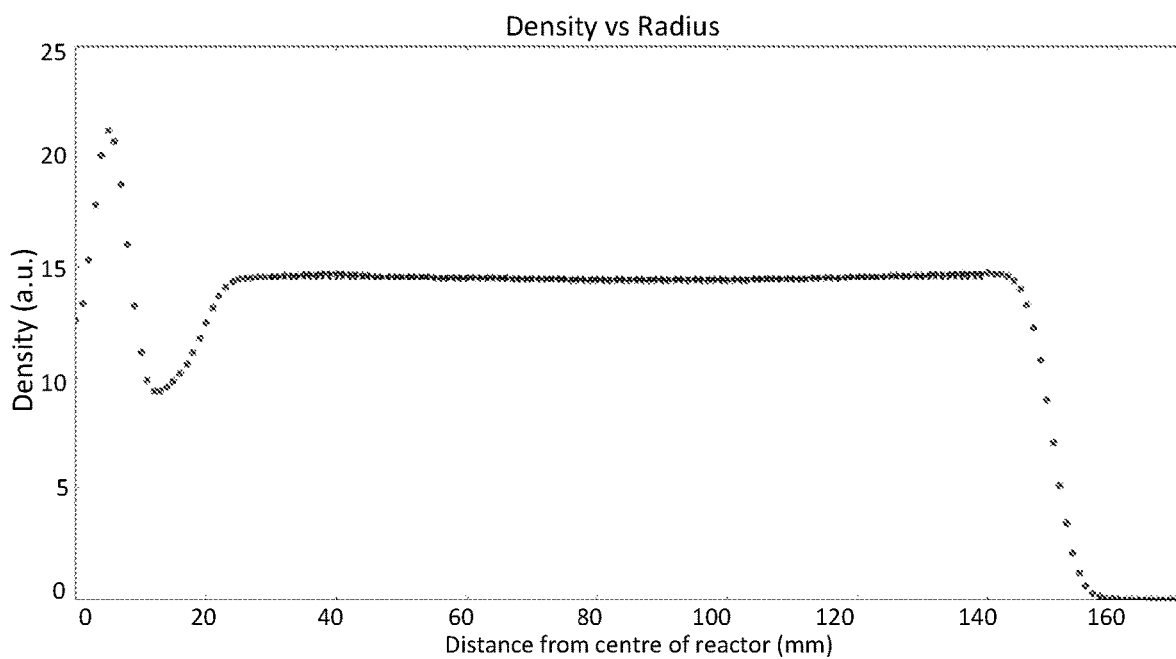
FIG. 29 shows a simulated total flux (density profile) that a susceptor is exposed to as a function of radius within a reaction chamber for the inlet arrangement shown in FIG. 28.
Figure 30A:
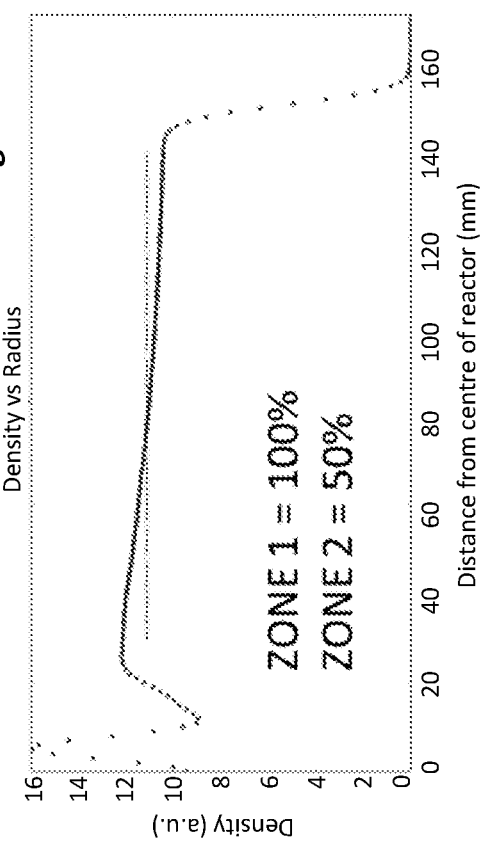
FIGS. 30A-D show examples of simulated total flux (density profiles) that a susceptor is exposed to as a function of radius within a reaction chamber for a 2-Zone showerhead according to an embodiment of the present disclosure.
Figure 30B:
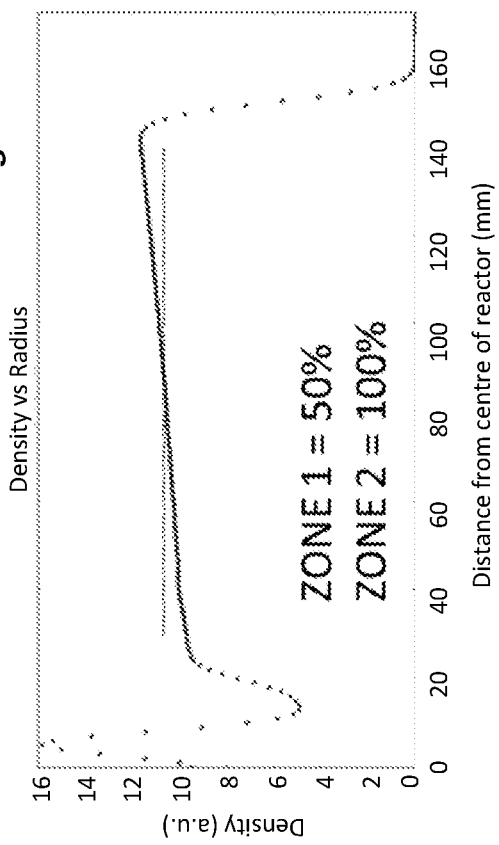
Figure 30C:
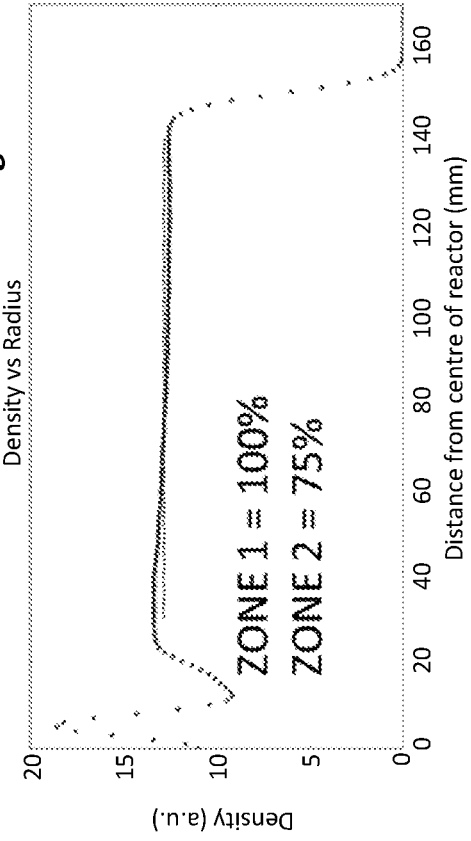
Figure 30D:
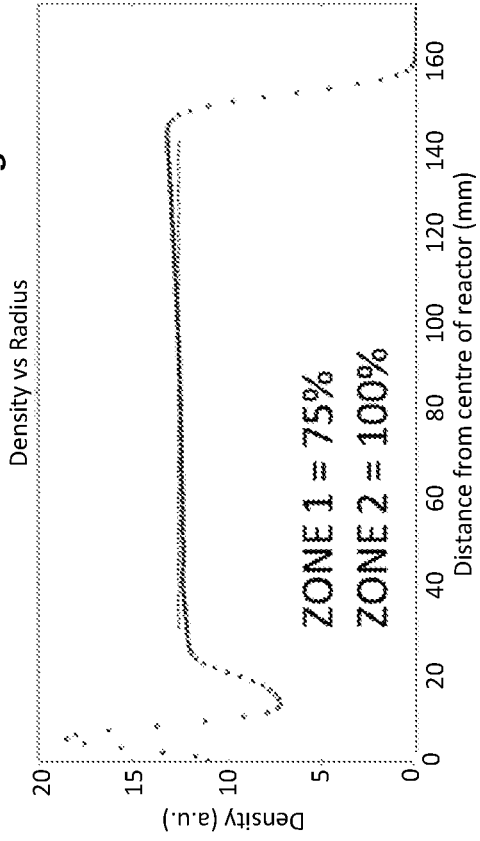

Each of the zones of the 2-Zone showerhead 3240 contain the same number of gas inlets (191 inlets each in this embodiment). In this manner, when each zone is run with the same flux of reagent and/or gas flow, the contribution of each zone to the total density profile at the surface of the susceptor, as a function of radius across the susceptor, should in theory be equal for a full rotation of the susceptor. Thus, as illustrated in FIG. 29, which shows the final density profile of injector species at the surface of a susceptor, for a full rotation of the susceptor, when both zones (Zone-1 and Zone-2) are run equally, i.e., with the same operating parameters such as reagent (e.g., MO) flux and carrier gas flow, a substantially uniform, flat density profile of injected species should be produced.

However, in practice, the total density profile may not be entirely uniform/flat. Nevertheless, the zone tuning disclosed herein allows manipulation of the total density profile by independently controlling the flux through each zone of a multi-zone showerhead, e.g. such that the flux profiles of different zones, while not flat, may be inverses of one another and will combine to produce a flat profile for a full rotation of the susceptor. FIGS. 30A-D show simulated density profiles of injected species which can be achieved when each zone of a 2-zone showerhead operate with using different operating parameters. This shows that adjusting the relative fluxes through each zone will change the simulated total flux (density profile) of injected species that a susceptor is exposed to as a function of radius, for a full rotation of the susceptor. Accordingly, the present disclosure shows the dependence of total density of injected species on the operating conditions of the gas inlets.

Controlling the flux through each zone, can be used to adjust, modify, or otherwise manipulate a non-uniform growth profile without requiring individual control of each gas inlet (e.g., each aperture). Furthermore, the demonstrated tunability of the overall density of injected species at a surface of the susceptor, for a full rotation of the susceptor, provides a user with the ability to manipulate a growth profile without requiring modifications to the reaction chamber, showerhead or other structural features of the apparatus. Further, a non-uniform growth profile may be tuned to become more uniform for a wide variety of process conditions, when the modification of the process conditions are known to affect the density profile.

As an example, density profiles may be affected by the plasma parameters and tuning may be applied accordingly. FIGS. 38A-C show thickness line profiles across a 4" wafer after deposition of 500 nm GaN for 3 different process conditions in a 2-zone showerhead. The standard deviation of thickness across the entire 4" wafer is also shown. FIG. 38A shows a relatively flat profile, with small standard deviation in thickness of only 0.35%, and was achieved with equal flux of MO provided to each MO zone. FIG. 38B shows the line when the same zones and same equal flux per zone of MO is applied as per FIG. 38A, but with plasma parameters modified during the growth process. Such modifications to the plasma parameters may be required depending on the target composition of the layer. For example, when growing device structures with many layers of different composition, the plasma parameters may be required to be different for each layer. The modified plasma parameters led to an increase in non-uniformity in thickness, with the standard deviation increasing to 1.6%. FIG. 38C shows the line when the layer was grown using the same plasma parameters as per FIG. 38B, but with the MO zones 'tuned' to modify the relative flux of MO between the zones in order to compensate for the non-uniformity introduced by the change in plasma parameters. This led to a reduction in thickness non-uniformity and decrease in the thickness standard deviation to 0.94%.

Figure 32:
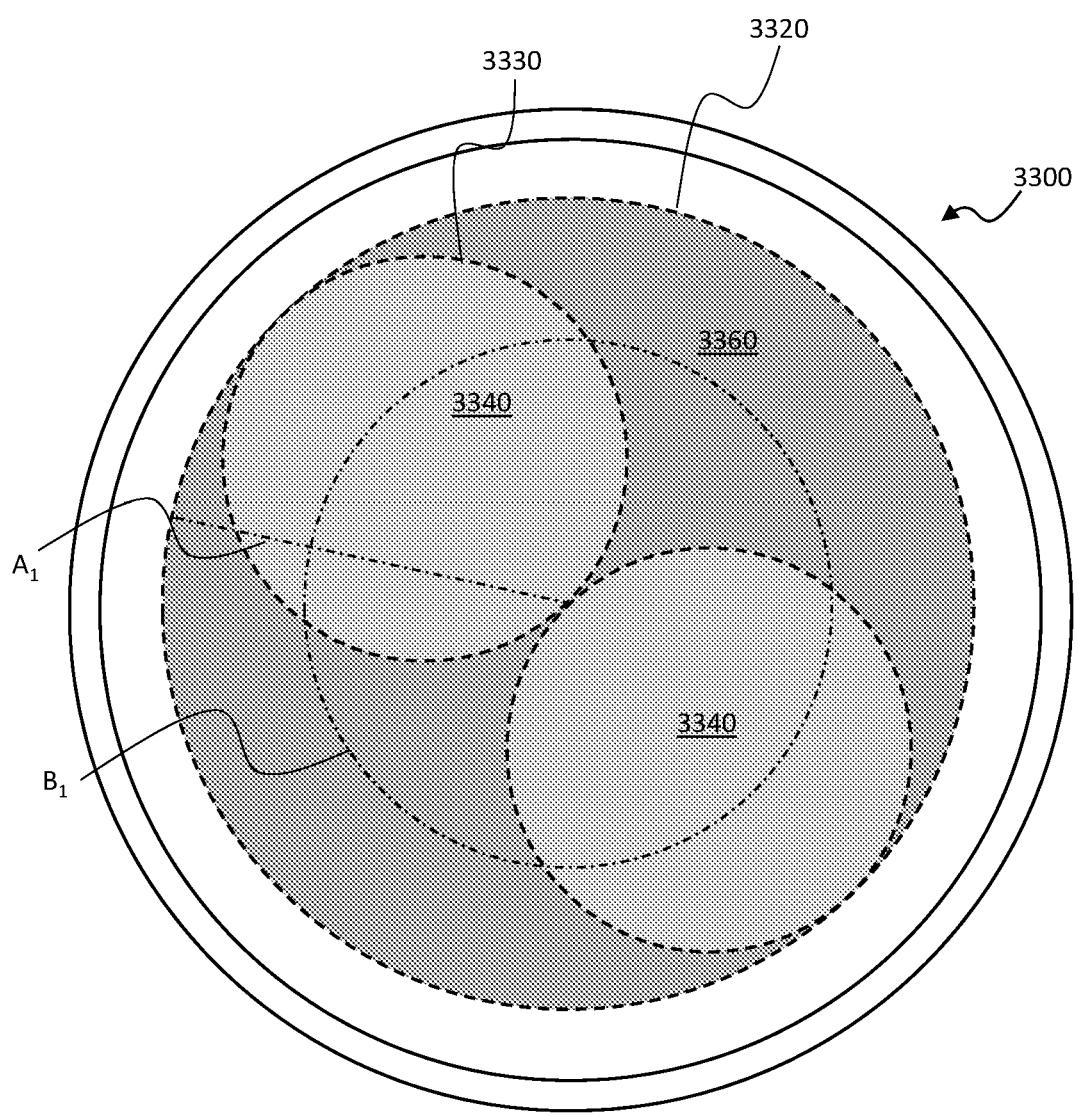
FIG. 32 shows a bottom view of a 2-Zone showerhead having a distribution of gas inlets according to an embodiment of the present disclosure.

Another example embodiment of a 2-zone showerhead 3300 is now discussed with reference to FIGS. 32 to 33D. In this embodiment, an array of gas inlets is provided in a uniform, grid pattern that extends across a substantially circular area of the showerhead indicated by line 3320. For simplicity, the gas inlets are not individually depicted in FIG. 32. Moreover, no plasma inlets are depicted. While plasma inlets may be included and gas inlets repositioned appropriately in accordance with preceding discussions, it is also recognised that the concept of zone tuning is advantageous regardless of the positioning and arrangement of plasma inlets in the showerhead.

Since the gas inlets are provided in a uniform grid pattern in this embodiment, were zones to be defined having equally sized sectors of the circular area 3320 and having the same number of gas inlets, the zones would not tend to favour any one or other of the inner and outer regions of the reaction chamber and therefore not be suitable for zone tuning in a manner as described above. In view of this, first and second zones 3340, 3360 have instead been configured in this embodiment with more complex shapes. For example, unlike zones based on sectors of a circle, the first and second zones 3340, 3360 partially overlap both in a radial direction between the central and outer region of the showerhead and in a rotational direction around the centre of the showerhead. Thus at least one notional radius $A_1$ on the surface of the showerhead between the central and outer region passes through both the first and second zones 3340, 3360 and at least one notional circular path Bi about the centre of the surface of the showerhead passes through both the first and second zones 3340, 3360.

In particular, the first and second zones 3340, 3360 are provided with different outer shapes that are inverse shapes of each other. In combination, the outer shapes of the first and second zones form a full circle 3320 having a radius R. The first zone 3340 is shaped as two adjacent non-overlapping circles each with a radius R/2, and the second zone 3360 is shaped as the inverse (or negative) of the two circles within the circular area 3320. Notably, since each circle with radius R/2 will have the same area as a quadrant of the circular area 3360, the areas of the first and second zones 3340, 3360 are necessarily equal and therefore comprise substantially the same number of gas inlets. In general, although not essential, it is advantageous if each zone has the same area (and therefore the same number of gas inlets) to make it easier to maintain the same gas flux through each zone.

A notional boundary line 3330 delineates the first and second zones 3340, 3360, the boundary line 3330 being non-linear and more specifically a curved line. Along the boundary line 3330, the zone 3340 has a number of convex outer edges and the second zone 3360 has a number of concave outer edges. The boundary line extends all of the way between the central and outer region of the surface and in fact across substantially the entire diameter of the showerhead. Therefore, each zone 3340, 3360 will provide some contribution to the gas density across substantially the entire final radial density profile. However, due to their different shapes, the number of gas inlets in the first zone 3340 is higher than the number of gas inlets in the second zone 3360 at radially inner regions of the surface of the showerhead, and the number of gas inlets in the second zone 3360 is higher than the number of gas in the first zone 3340 at radially outer regions of the surface of the showerhead. Accordingly, the first zone 3340 can be considered to favour the inner region of the reaction chamber and the second zone 3360 can be considered to favour the outer region of the reaction chamber.

Figure 33A:
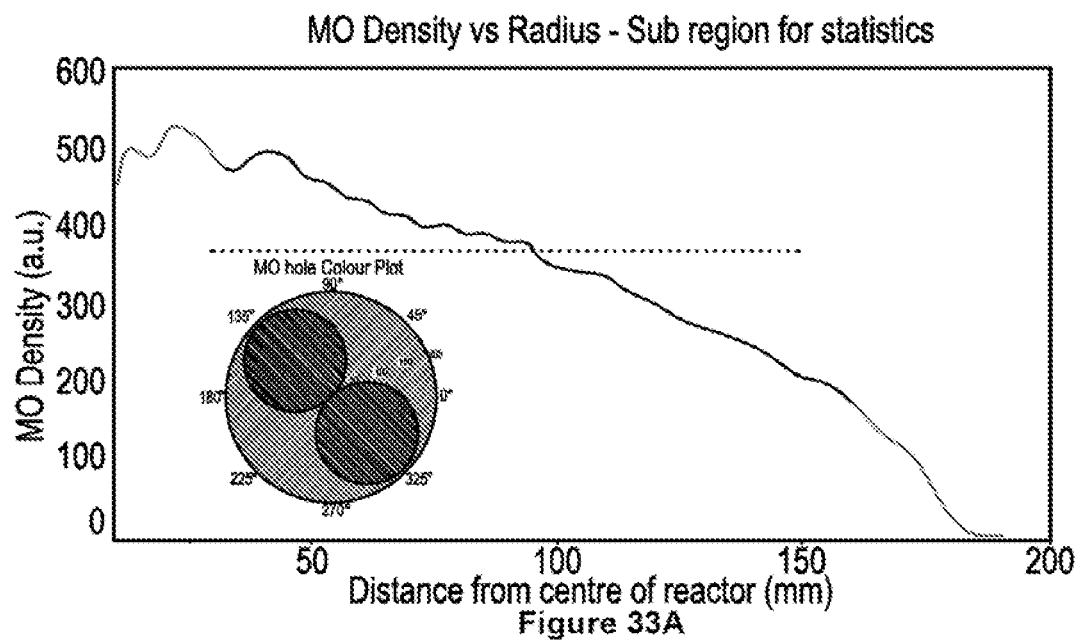
FIGS. 33A-D show simulated total flux (density profiles) that a susceptor is exposed to as a function of radius within a reaction chamber for the inlet arrangement shown in FIG. 32 when one or other or both zones deliver gas to the susceptor.
Figure 33B:
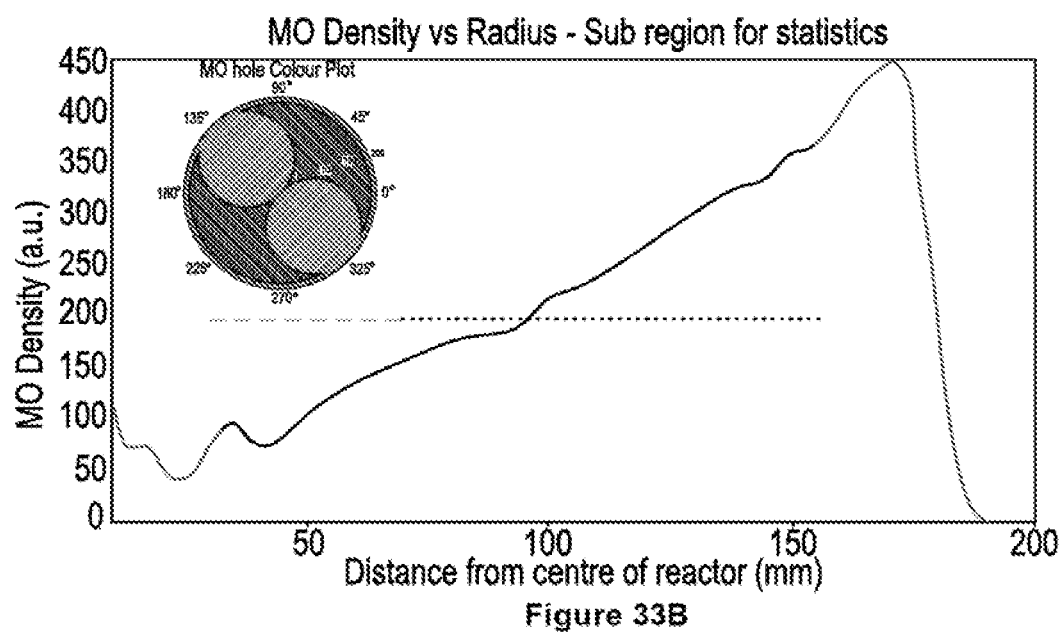
Figure 33C:
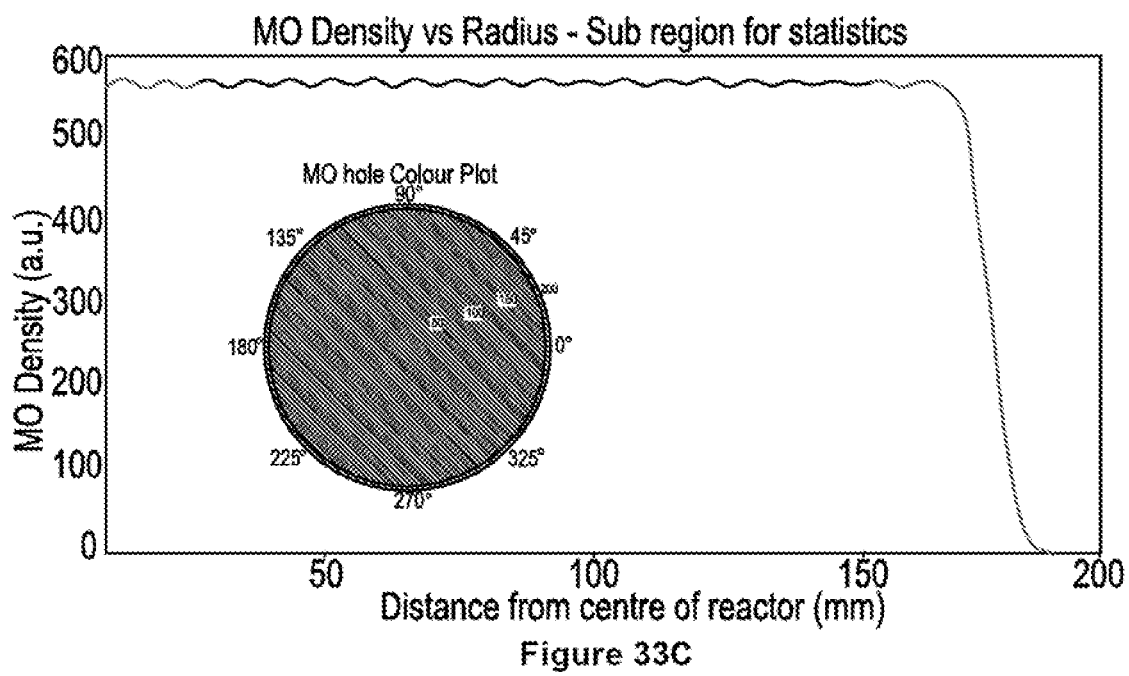
Figure 33D:
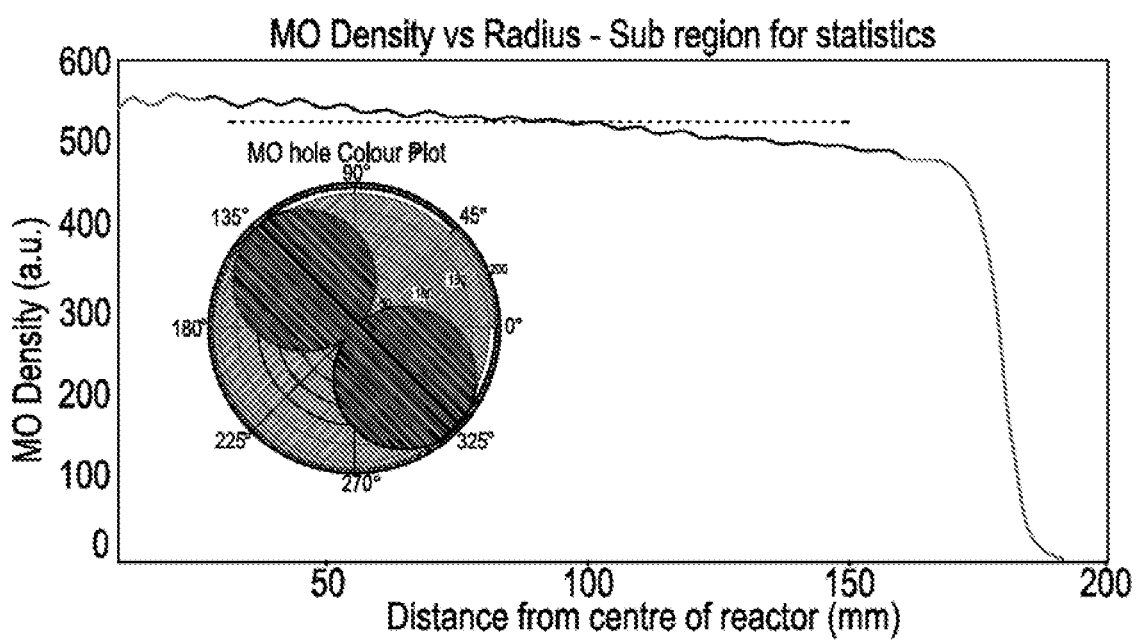

FIGS. 33A to 33C show density profiles of a similar type to those for preceding embodiments, and when gas of equal flux is delivered from the first zone only (FIG. 33A), second zone only (Figured 33B) and both the first and second zones at the same time (FIG. 33C).

When gas is delivered from the first zone 3340, the density profile is skewed towards being thicker to the inner region and, when the gas is delivered from the second zone 3360, the density profile is skewed towards being thicker to the outer region. When both zones deliver the gas, a substantially uniform overall gas density profile is achieved. Should it be desired to tune the gas density profile to account for disturbances that might mean that the overall gas density profile is not uniform, e.g. is still skewed to one or other of the outer and inner regions, the two different zones may be controlled to operate with different parameters. FIG. 33D shows an adjusted overall gas density profile when the second zone 3360 is run at 80% of the flux of the first zone 3340.

Figure 34:
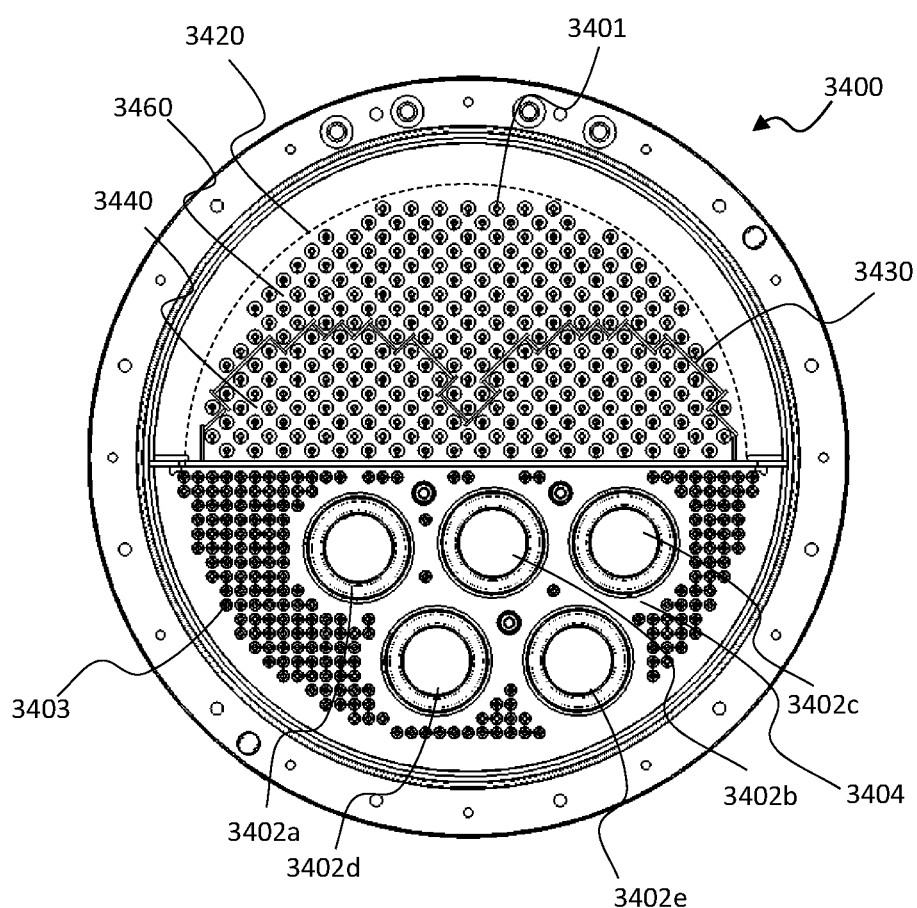
FIG. 34 shows a bottom view of a showerhead having a distribution of gas and plasma inlets according to an embodiment of the present disclosure.

Yet another embodiment of a 2-zone showerhead 3400 is now discussed with reference to FIGS. 34 to 35C. In this embodiment, an array of gas inlets 3401 is again provided in a uniform, grid pattern but that only extends across a substantially semi-circular area of the showerhead generally indicated by line 3420. In this embodiment, every second gas inlet 3401 may be arranged to deliver a different gas, e.g. MO or $NH_3$. In this embodiment, five plasma inlets 3402a-e are provided in the showerhead 3400, located in an opposite semi-circular area 3404 of the showerhead and surrounded by purge inlets 3403. The plasma inlets 3402a-e are configured in a similar manner to those discussed above with reference to FIG. 20. The purge inlets 3403 are configured to deliver purge gas in otherwise dead spaces around the plasma inlets where gas inlets 3401 are absent. The purge gas (e.g. $N_2$) is selected so that it will not contribute to any deposition on a substrate (and therefore film thickness) or associated density profile, and can reduce unwanted recirculation of reagent gas. For example, it may prevent thin films forming on the showerhead and may help obtain better plasma gas distribution.

Again, first and second zones 3440, 3460 are provided with different outer shapes that are inverse shapes of each other. In combination, the outer shapes of the first and second zones 3440, 3460 form a semi-circular area 3420 having a radius R. The first zone 3440 is shaped as two adjacent non-overlapping semi-circles each with a radius R/2, and the second zone 3460 is the inverse (or negative) of the two semi-circles within the semi-circular area 3420. Notably, since each semi-circle with radius R/2 will have the same area as a quadrant (i.e. half) of the semi-circular area 3420, the areas of the first and second zones 3440, 3460 are necessarily equal and therefore comprise substantially the same number of gas inlets 3401. In general, although not essential, it is advantageous if each zone has the same area (and therefore the same number of gas inlets) to make it easier to maintain the same gas flux through each zone.

A notional boundary line 3430 delineates the first and second zones 3440, 3460, the boundary line 3430 being non-linear and more specifically a generally curved line. Along the boundary line 3430, the zone 3440 has two convex outer edges and the second zone 3460 has two concave outer edges. The boundary line 3430 extends all of the way between the central and outer region of the surface and in fact across substantially the entire diameter of the showerhead 3400. Therefore, each zone 3440, 3460 will provide some contribution to the gas density across substantially the entire final radial density profile. However, due to their different shapes, the number of gas inlets 3401 in the first zone 3440 is higher than the number of gas inlets in the second zone 3460 at radially inner regions of the surface of the showerhead, and the number of gas inlets 3401 in the second zone 3460 is higher than the number of gas in the first zone 3440 at radially outer regions of the surface of the showerhead 3400. Accordingly, the first zone 3440 can be considered to favour the inner region of the reaction chamber and the second zone 3460 can be considered to favour the outer region of the reaction chamber.

Figure 35A:
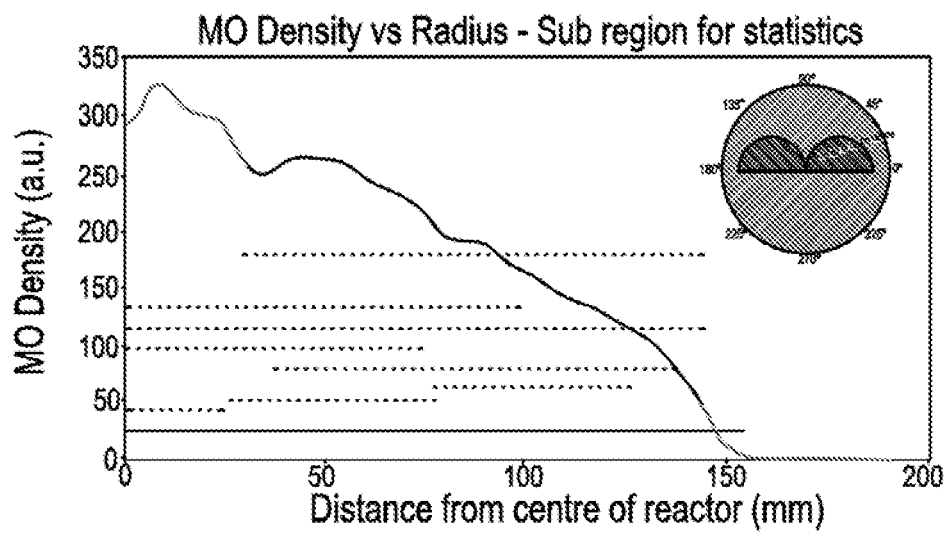
FIGS. 35A-C show simulated total flux (density profiles) that a susceptor is exposed to as a function of radius within a reaction chamber for the inlet arrangement shown in FIG. 34 when one or other or both zones deliver gas to the susceptor.
Figure 35B:
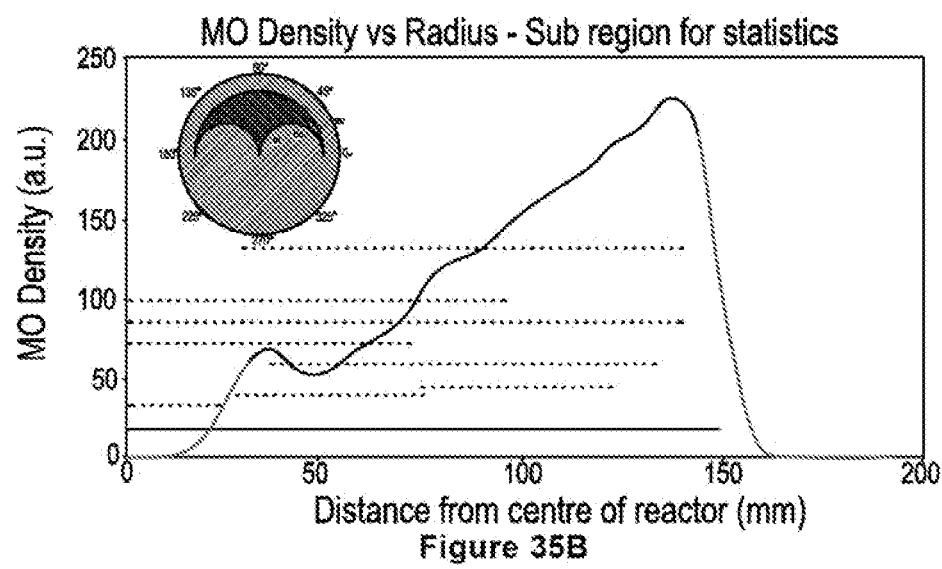
Figure 35C:
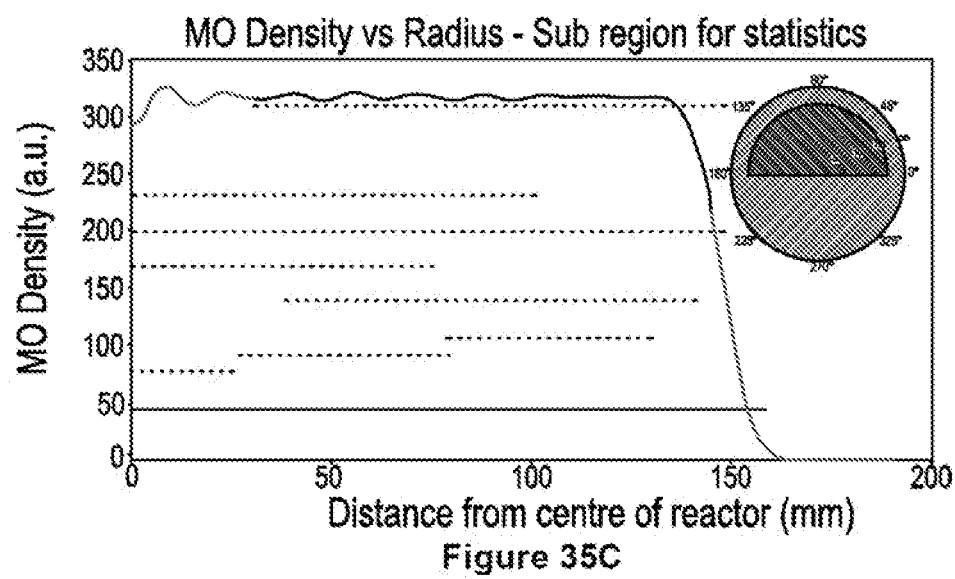

FIGS. 35A to 35C show density profiles of a similar type to those for preceding embodiments when gas of equal flux is delivered from the first zone only (FIG. 35A), second zone only (Figured 35B) and both the first and second zones at the same time (FIG. 35C).

When gas is delivered from the first zone 3440, the density profile is skewed towards being thicker to the inner region and, when the gas is delivered from the second zone 3460, the density profile is skewed towards being thicker to the outer region. When both zones deliver the gas, a substantially uniform overall gas density profile is achieved. Again, tuning of the gas density profile is possible by controlling the gas flux through the first and second zones 3440, 3460 independently.

In this embodiment, while a substrate on the susceptor may be exposed across its surface to a substantially uniform density of each of the reagent gas and plasma for a full rotation of the susceptor, it will be recognised that the actual exposure of the substrate to the gas and/or plasma occurs within approximately a half-rotation of the susceptor only.

Figure 36:
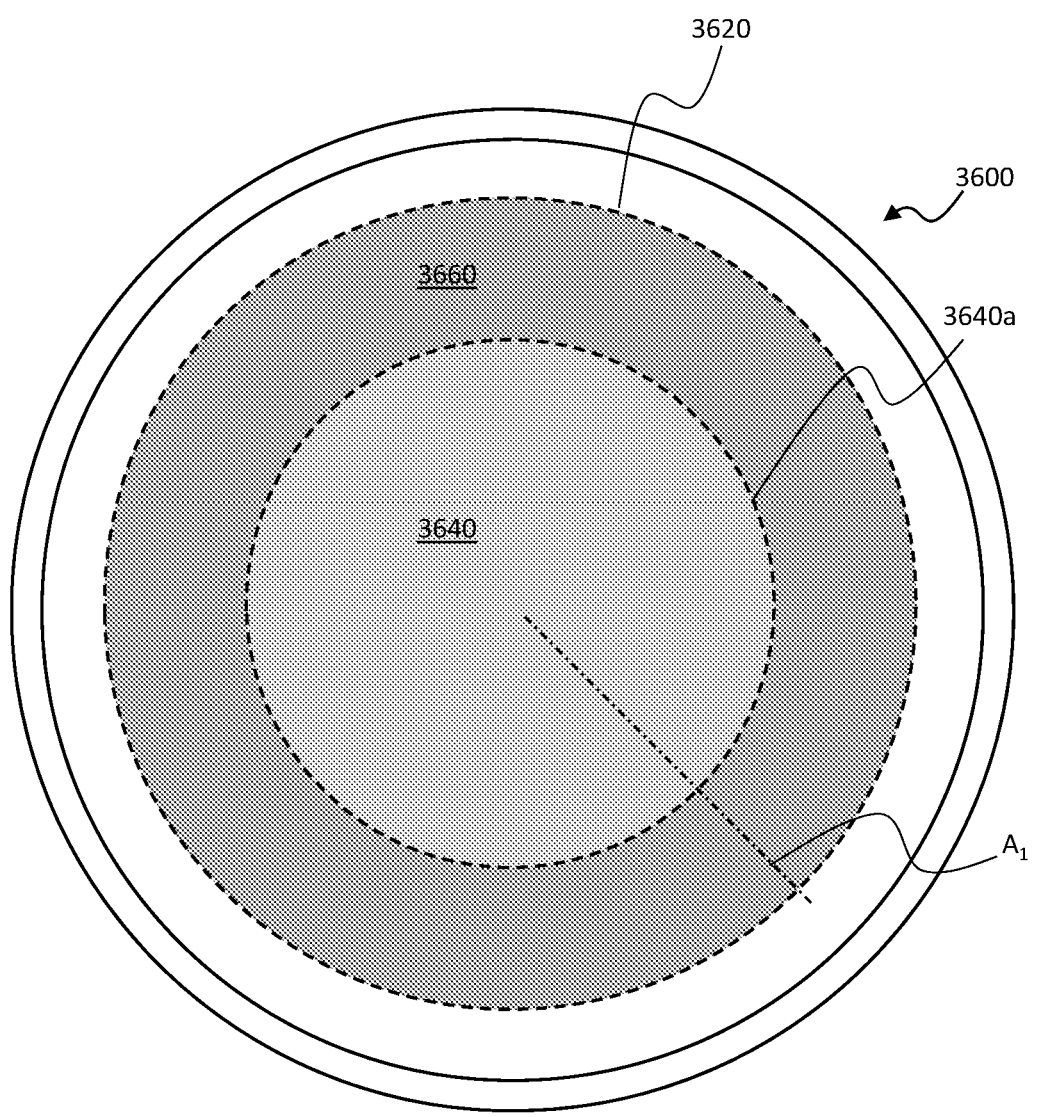
FIG. 36 shows a bottom view of a 2-Zone showerhead having a distribution of gas inlets according to an embodiment of the present disclosure.

Yet another embodiment of a 2-zone showerhead 3600 is now discussed with reference to FIG. 36. In this embodiment, an array of gas inlets is provided in a uniform pattern, e.g. a grid or circular array pattern, that extends across a substantially circular area of the showerhead indicated by line 3620. For simplicity, the gas inlets are not individually depicted in FIG. 36. As for the embodiment of FIG. 32, no plasma inlets are depicted but may be included.

In this embodiment, unlike zones based on sectors of a circle, first and second zones 3640, 3660 are provided that completely overlap in a radial direction between the central and outer region of the showerhead. Therefore at least one notional radius $A_1$ on the surface of the showerhead between the central and outer region passes through both the first and second zones 3640, 3660.

In particular, the first zone 3640 is provided with a circular shape at the inner, central region of the showerhead and the second zone 3660 is provided with an annular shape immediately to the outer radial side of the first zone 3640. In combination, the outer shapes of the first and second zones form a full circle 3620 having a radius R. The boundary of the first zone i.e. 3640a has a radius $R/\sqrt{2}$ and therefore each zone 3640, 3660 has a substantially equal area and comprise substantially the same number of gas inlets.

In this embodiment, each of the zones 3640, 3660 may again be used to deliver gas flux that is independently adjustable and therefore can be controlled differently at radially inner and outer regions of the reaction chamber. The adjustment may be used to directly compensate for changes in the profile of the gas delivered from that zone caused by non-uniformities in the apparatus. As one example, non-uniformities may be caused by one or more plasma tubes positioned in that zone (or at least at a corresponding radial location to that zone), and dependent on their exact positions and/or conditions under which they are selected to run (e.g. plasma flux, power, coil height, etc.). The adjustment may again be carried out to achieve a substantially uniform distribution of gas density overall, at the surface of the susceptor for a full rotation of the susceptor.

Figure 37A:
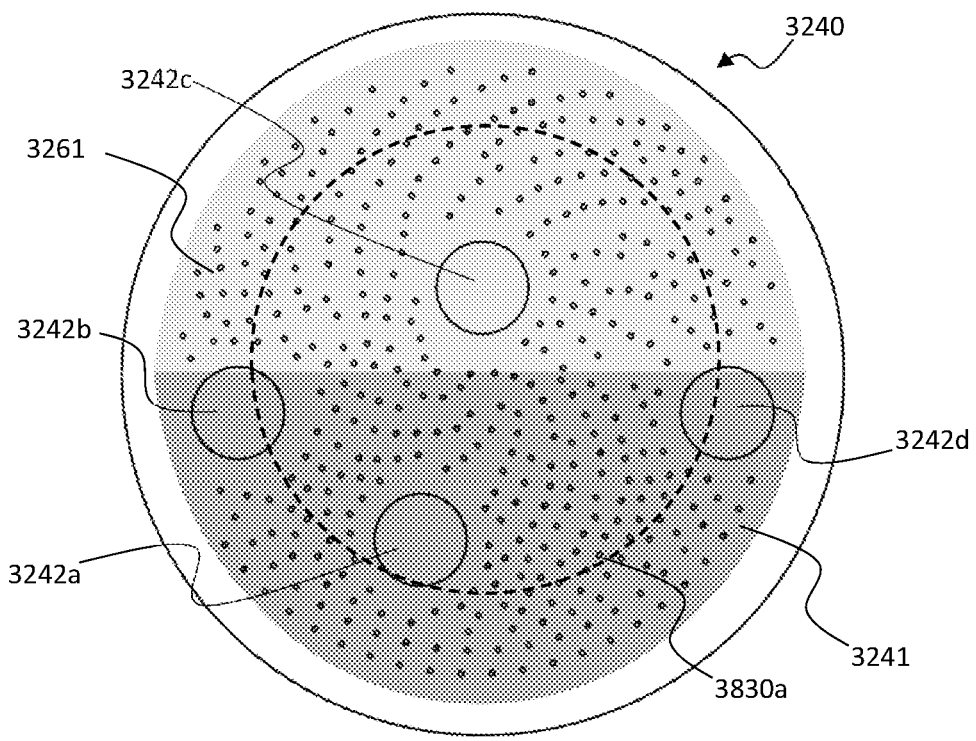
FIGS. 37A and 37B show bottom views of showerheads according to FIGS. 28 and 31, respectively, with a 2-Zone distribution of gas inlets applied according to embodiments of the present disclosure.
Figure 37B:
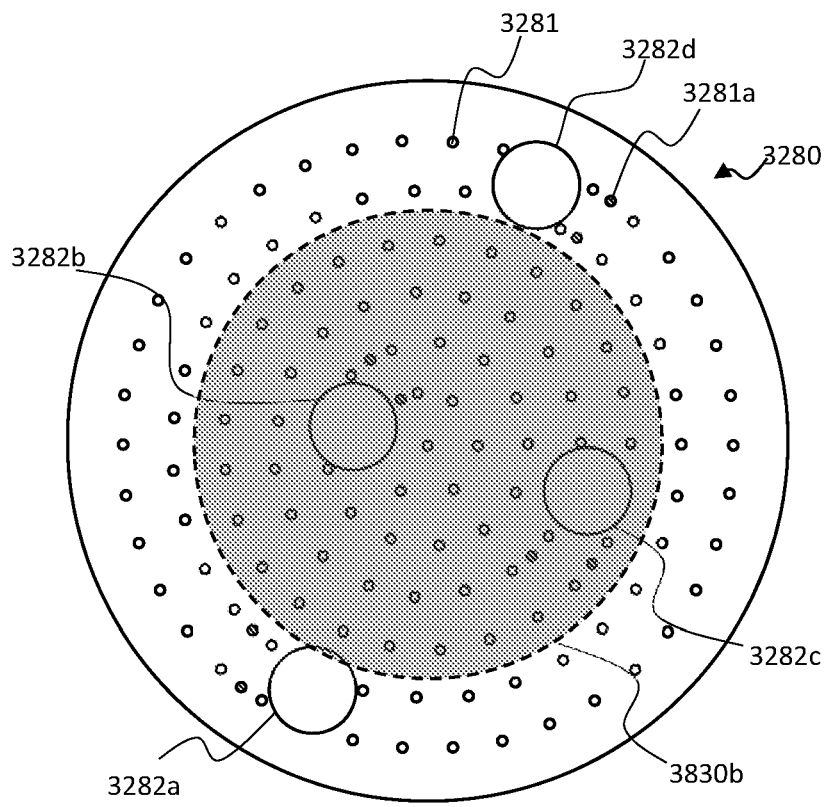

Examples of how such annular zoning might be applied to showerheads including plasma inlets, and configured in accordance with showerheads 3240, 3280 discussed above, are illustrated in FIGS. 37A and 37B, the zones being roughly delineated by boundary lines 3830a, 3830b at a radius $R/\sqrt{2}$ so that each zone has equal area. In practice, there may be slight deviations or bending in the boundary lines depending on the positioning of the plasma inlets or otherwise. For example, in some embodiments, it may be desirable for zones (e.g. annular zones) to radially interpenetrate each other in proximity to their boundary with each other, e.g. to prevent a 'hard edge' between the zones. The boundary line between zones may therefore have a toothed or star-shaped configuration in some embodiments. The result may be that, at the boundary line, some gas inlets from different generally annular zones are at the same radius, for example, or are located further into the generally annular region predominantly occupied by another zone.

Should more than two zones (i.e. a total N number of zones) be desirable of equal area within an area of overall radius R, the nth zone will have a radius $r_n$, where $r_n = R*\sqrt{(n/N)}$. Nevertheless, it is not essential that each zone should be of identical area or have the same number of gas inlets.

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

The invention claimed is:

1. An RPCVD apparatus for forming a film comprising:
one or more plasma generators to generate a plasma from a source comprising nitrogen;
a reaction chamber in which to react a metal organic reagent with a reactive nitrogen species derived from the nitrogen plasma so as to deposit a film on one or more substrates;
a showerhead having:
    at least one gas chamber;
    one or more plasma inlets to deliver plasma from the one or more plasma generators into the reaction chamber; and
    a plurality of gas inlets to deliver gas from the at least one gas chamber into the reaction chamber;
a susceptor for supporting one or more substrates in the reaction chamber at a surface of the susceptor between a central region and an outer region of the susceptor, the susceptor being configured to rotate relative to the showerhead around an axis of rotation;
wherein at least one of the one or more plasma inlets is located at a position that is between a central region and an outer region of the showerhead and off-centre from the axis of rotation;
wherein the gas inlets are distributed in one or more augmented spiral patterns at a surface of the showerhead between the central region and the outer region of the showerhead;
wherein the gas inlets each direct gas having a respective spatial distribution of gas at the surface of the susceptor;
wherein the one or more plasma generators generate plasma in line of sight of the susceptor and wherein the one or more plasma inlets each have an opening with an area that is at least 500× larger than an area of the openings of the each of the gas inlets; and
wherein the one or more augmented spiral patterns of gas inlets includes clustering of gas inlets where the average distance between gas inlets and their respective closest adjacent gas inlet is lower than the average distance between closest adjacent gas inlets across the entire showerhead, and wherein the clustering of gas inlets is more prevalent in areas of the surface of the showerhead where gas inlets are at the same radial distances from the centre of the showerhead as the one or more plasma inlets than at areas of the surface of the showerhead where gas inlets are at different radial distances from the centre of the showerhead than the one or more plasma inlets such that a combination of all of the spatial distributions of gas from the gas inlets provides a uniform distribution of gas density on the surface of the susceptor between a central region and an outer region of the susceptor, for a full rotation of the susceptor.

2. The RPCVD apparatus according to claim 1, wherein the gas inlets are clustered at first regions of the surface of the showerhead and the one or more plasma inlets are located at second regions of the surface of the showerhead.

3. The RPCVD apparatus according to claim 2, wherein clustering of the gas inlets provides space in the showerhead to accommodate the one or more plasma inlets at the second regions of the surface of the showerhead while retaining substantially the same distribution of gas density at the surface of the susceptor, between the central region and the outer region of the susceptor, for a full rotation of the susceptor, as if the gas inlets were uniformly distributed across the first and second regions of the surface of the showerhead.

4. The RPCVD apparatus according to claim 2, wherein the clustering of gas inlets is more prevalent for gas inlets in areas where gas inlets are at the same radial distances from the centre of the showerhead as the one or more plasma inlets and are relatively closer to the one or more plasma inlets than at areas where gas inlets are at the same radial distances from the centre of the showerhead as the one or more plasma inlets but are relatively farther away from the one or more plasma inlets.

5. The RPCVD apparatus according to claim 1, wherein the opening of each of the one or more plasma inlets has an area that is at least 1000×, at least 10,000×, at least 20,000×, or at least 50,000× larger than the area of the opening of each of the gas inlets.

6. The RPCVD apparatus according to claim 1, wherein:
the gas inlets are distributed over an area that is more than 50%, or more than 75%, of the area of the surface of the showerhead between the central region and outer region of the showerhead; or
wherein the surface of the showerhead has four notional quadrants and the gas inlets are distributed in 3 or all 4 of the quadrants.

7. The RPCVD apparatus according to claim 1, wherein the plurality of gas inlets comprises at least a first subset of gas inlets and a second subset of gas inlets and wherein the apparatus comprises a controller that controls the flux of gas delivered from each of the subsets of gas inlets independently of each other.

8. The RPCVD apparatus according to claim 7, wherein, for each subset of gas inlets, a combination of all of the spatial distributions of gas from the gas inlets within that subset provides a non-uniform distribution of gas density on the surface of the susceptor between the central region and outer region of the susceptor, for a full rotation of the susceptor, and
wherein the gas inlets are configured such that a combination of all of the non-uniform distributions of gas density provides a uniform distribution of gas density on the surface of the susceptor between the central region and outer region of the susceptor, for a full rotation of the susceptor.

9. The RPCVD apparatus according to claim 8, wherein:
gas delivered by the first subset of gas inlets has a first radial density profile between the central region and outer region of the susceptor, for a full rotation of the susceptor, that decreases from the central region to the outer region of the susceptor; and
gas delivered by the second subset of gas inlets has a second radial density profile between the central region and outer region of the susceptor, for a full rotation of the susceptor, that increases from the central region to the outer region of the susceptor; and
the combination of gas delivered by the first subset of gas inlets and the second subset of gas inlets has a total radial density profile between the central region and outer region of the susceptor, for a full rotation of the susceptor, that is substantially flat.

10. The RPCVD apparatus according to claim 9, wherein the controller is operable to tune the first and/or second radial density profiles such that the total radial density profile is substantially flat.

11. The RPCVD apparatus according to claim 7, wherein the gas inlets of the first subset of gas inlets are distributed over a first zone of the surface of the showerhead and the gas inlets of the second subset of gas inlets are distributed over a second zone of the surface of the showerhead, and wherein the first and second zones partially overlap in a radial direction between the central and outer region of the showerhead.

12. The RPCVD apparatus according to claim 7, wherein the gas inlets of the first subset of gas inlets are distributed over a first zone of the surface of the showerhead and the gas inlets of the second subset of gas inlets are distributed over a second zone of the surface of the showerhead, and wherein, in combination, the outer shapes of the first and second zones form a sector of a circle or form a full circle.

13. The RPCVD apparatus according to claim 7, wherein the gas inlets of the first subset of gas inlets are distributed over a first zone of the surface of the showerhead and the gas inlets of the second subset of gas inlets are distributed over a second zone of the surface of the showerhead, and wherein a notional boundary line that delineates the first and second zones is non-linear.

14. The RPCVD apparatus according to claim 13, wherein the notional boundary line extends all of the way between the central and outer region of the surface of the showerhead or across substantially the entire diameter of the showerhead.

15. The RPCVD apparatus according to claim 7, wherein the first subset of gas inlets delivers metal organic reagent gas, and the second subset set of gas inlets deliver $NH_3$ gas; or wherein the first subset of gas inlets delivers both metal organic reagent gas and $NH_3$ gas, and the second subset of gas inlets delivers both metal organic reagent gas and $NH_3$ gas.

16. The RPCVD apparatus according to claim 1, wherein the one or more plasma inlets each direct plasma having a respective spatial distribution of plasma intensity at the surface of the susceptor, and wherein the one or more plasma generators and/or one or more plasma inlets are configured such that a combination of all of the spatial distributions of plasma intensity provides a substantially uniform distribution of plasma density at the surface of the susceptor between the central region and the outer region of the susceptor, for a full rotation of the susceptor.

17. The RPCVD apparatus according to claim 16, configured such that a notional circular path at the surface of the susceptor, around the axis of rotation and between the central region and the outer region of the susceptor, is exposed to a total plasma intensity, for a full rotation of the susceptor, that increases for increasing radial distance (r) of the circular path from the axis of rotation.

18. The RPCVD apparatus according to claim 17, configured such that the increase in total plasma intensity for increasing radial distance (r) of the circular path from the axis of rotation is proportional to r.

19. The RPCVD apparatus according to claim 16, wherein the showerhead has one or more plasma inlets towards the outer region of the showerhead that are configured to direct plasma of higher plasma intensity than one or more plasma inlets positioned towards the central region of the showerhead.

20. The RPCVD apparatus according to claim 1, wherein the one or more plasma inlets comprise a plurality of plasma inlets positioned in the showerhead such that at least one notional circular path at the showerhead, around the axis of rotation, passes through at least two of the plurality of plasma inlets or at least three of the plurality of plasma inlets.

21. The RPCVD apparatus according to claim 1, further comprising a controller to individually control the plasma intensity directed from one or more of the one or more plasma inlets, wherein the controller is configured to control the plasma intensity by at least one of:
(i) adjusting a power used to generate the plasma; and
(ii) adjusting a gas flow from the nitrogen source at the plasma inlet.

22. The RPCVD apparatus according to claim 1, wherein the diameter of all of the one or more plasma inlets is substantially the same.

23. The RPCVD apparatus according to claim 1, wherein the one or more plasma inlets comprise a plurality of plasma inlets and two or more of the plurality of plasma inlets have different diameters.

24. The RPCVD apparatus according to claim 1, wherein the one or more plasma inlets comprise a plurality of plasma inlets and the plurality of plasma inlets are distributed in a non-uniform pattern or non-radially symmetric pattern at the showerhead.

* * * * *